(12) United States Patent
Majima et al.

(10) Patent No.: US 12,693,349 B2
(45) Date of Patent: Jul. 28, 2026

(54) MAGNETIC DETECTION DEVICE

(71) Applicants: SHIMADZU CORPORATION, Kyoto (JP); OPTOHUB CO., LTD., Tomi (JP)

(72) Inventors: Yatsuse Majima, Kyoto (JP); Akira Nagumo, Saitama (JP); Hiroshi Takano, Saitama (JP)

(73) Assignees: SHIMADZU CORPORATION, Kyoto (JP); OPTOHUB CO., LTD., Tomi (JP)

( * ) Notice: Subject to any disclaimer, the term of this patent is extended or adjusted under 35 U.S.C. 154(b) by 244 days.

(21) Appl. No.: 18/397,690

(22) Filed: Dec. 27, 2023

(65) Prior Publication Data

US 2024/0280648 A1     Aug. 22, 2024

(30) Foreign Application Priority Data

Feb. 21, 2023     (JP) ................................. 2023-025589

(51) Int. Cl.
*G01R 33/02*        (2006.01)
*G01R 33/00*        (2006.01)
*G01R 33/05*        (2006.01)

(52) U.S. Cl.
CPC ..... G01R 33/0206 (2013.01); G01R 33/0005 (2013.01); *G01R 33/05* (2013.01)

(58) Field of Classification Search
CPC . G01R 33/0206; G01R 33/0005; G01R 33/05
See application file for complete search history.

(56) References Cited

U.S. PATENT DOCUMENTS

| | | | |
|---|---|---|---|
| 10,184,991 B2 * | 1/2019 | Lee ......................... | G01R 33/04 |
| 12,436,210 B1 * | 10/2025 | Lin ......................... | G01R 33/02 |
| 2012/0206134 A1 * | 8/2012 | Fischer ................ | G01R 33/091 |
| | | | 324/244 |

(Continued)

FOREIGN PATENT DOCUMENTS

| | | |
|---|---|---|
| CN | 113253162 B | 4/2022 |
| CN | 115248403 A | 10/2022 |

(Continued)

OTHER PUBLICATIONS

Yoshimi et al., "Microfabricated Thin-Film Flux-Gate Magnetic Sensor and its Applications," Shimadzu Hyoron, Shimadzu Hyoron Editorial Unit, Aug. 1999, vol. 56, No. 1 & 2, pp. 19-28.

(Continued)

*Primary Examiner* — Reena Aurora
(74) *Attorney, Agent, or Firm* — Muir Patent Law, PLLC

(57)        ABSTRACT

This magnetic detection device is provided with a plurality of magnetic sensors each including an excitation coil, a signal coil, and magnetic core layer, a driving circuit, and a detection circuit. A first axis sensor unit is constituted by at least two magnetic sensors out of the plurality of magnetic sensors, the at least two magnetic sensors being each arranged such that a detection direction thereof is aligned with a first axial direction. A second axis sensor unit is constituted by at least one magnetic sensor out of the plurality of magnetic sensors, the at least one magnetic sensor being arranged such that a detection direction thereof is aligned with a second axial direction intersecting with the first axial direction.

11 Claims, 8 Drawing Sheets

(56) References Cited

U.S. PATENT DOCUMENTS

| | | |
|---|---|---|
| 2014/0210463 A1 | 7/2014 | Klein |
| 2014/0218018 A1 | 8/2014 | Ivanov et al. |

FOREIGN PATENT DOCUMENTS

| | | |
|---|---|---|
| EP | 1092163 A1 | 4/2001 |
| FR | 2740556 A1 | 4/1997 |
| JP | 2971989 | 8/1999 |
| JP | 2000-338210 A | 12/2000 |
| JP | 2006-003190 A | 1/2006 |
| JP | 2006-010591 A | 1/2006 |
| JP | 2003-149312 B | 5/2007 |
| JP | 05064706 | 8/2012 |
| WO | 2008/016198 A1 | 2/2008 |

OTHER PUBLICATIONS

Extended European Search Report (EESR) dated Jul. 4, 2024 in the corresponding European patent application No. 24153668.9.

* cited by examiner

IV-IV Cross-section

MAGNETIC DETECTION DEVICE

CROSS-REFERENCE TO RELATED APPLICATIONS

The related application number JP2023-025589, entitled "Magnetic Detection Device," filed on Feb. 21, 2023, and invented by Yatsuse MAJIMA, Akira NAGUMO, and Hiroshi TAKANO, upon which this patent application is based, is hereby incorporated by reference.

BACKGROUND OF THE INVENTION

Field of the Invention

The present invention relates to a magnetic detection device, and more specifically to a magnetic detection device equipped with an excitation coil and a signal coil.

Description of the Related Art

The following description sets forth the inventor's knowledge of the related art and problems therein and should not be construed as an admission of knowledge in the prior art.

Conventionally, a magnetic sensor equipped with an excitation coil and a signal coil is known. Such a device is disclosed, for example, in "Microfabricated Thin-Film Flux-Gate Magnetic Sensor and its Applications," Shimadzu Hyoron, Shimadzu Hyoron Editorial Unit, August 1999, Vol. 56, No. 1 & 2, p. 19-28 authored by YOSHIMI and other five authors (hereinafter referred to as "Non-Patent Document 1").

Non-Patent Document 1 described above describes a TFG sensor element (Thin-Film Flux-Gate magnetic sensor element) formed on a board. The TFG sensor element described in the above-described Non-Patent Document 1 is provided with an annular ring core, an excitation coil, and a receiving coil.

The ring core is formed on the board by a permalloy thin film. Then, an upper wiring layer and a lower wiring layer each made of thin pattern plating are laminated on top and bottom of a ring core via an insulating layer. The upper wiring layer and the lower wiring layer are connected to form an excitation coil and a receiving coil three-dimensionally around the ring core.

Around the ring core, the receiving coil and the excitation coil are wound alternately. Further, in order to make the receiving coil differential, the winding direction of the receiving coil is reversed every half circumference of the ring core. In the TFG sensor element described in the above-described Non-Patent Document 1, the position at which the winding direction of the receiving coil is reversed for every half circumference of the ring core is a position of the sensitivity axis.

Further, the above-described Non-Patent Document 1 describes one example of a biaxial TFG element with two orthogonal sensitivity axes in one TFG element. In a biaxial TFG element, the receiving coil is divided into four parts at 90 degrees of each ring core. The winding directions of one pair of receiving coils facing each other among the four divided receiving coils are opposite to each other. In a biaxial TFG element, the pair of receiving coils facing each other differentially detect the magnetic field in one direction, thereby detecting magnetic fields in two orthogonal directions.

However, in the case of dividing the receiving coil to detect magnetic fields in a plurality of directions as in the TFG sensor element described in the above-described Non-Patent Document 1, the winding number of the receiving coil to detect the magnetic field in one direction is small. For this reason, the sensitivity for each direction is reduced since a plurality of directions of magnetic fields are detected.

Further, although not described in the above-described Non-Patent Document 1, in order to detect magnetic fields in a plurality of directions, it is conceivable to arrange single-axis TFG sensor elements each for detecting a magnetic field in one direction side by side while reversing the direction one by one. In that case, since the TFG sensor elements (magnetic sensors) each for detecting a magnetic field in one direction are arranged side by side, the center positions of the sensors are separated from each other for each of the plurality of directions. Therefore, when detecting magnetic fields in a plurality of directions, it is difficult to bring the detection positions closer to each other.

As described above, when detecting magnetic fields in a plurality of directions, it is desirable to bring the detection positions for each of the magnetic fields in a plurality of directions closer to each other while suppressing the reduction in sensitivity.

SUMMARY OF THE INVENTION

The present invention has been made to solve the above-described problems. One object of the present invention is to provide a magnetic detection device capable of bringing detection positions for each magnetic field in a plurality of directions closer to each other while suppressing decrease in sensitivity when detecting magnetic fields in a plurality of directions.

A magnetic detection device according to one aspect of the present invention includes:

a plurality of magnetic sensors each including an excitation coil, a signal coil, and a magnetic core layer, the excitation coil and the signal coil each being formed as a conductor pattern on a board, the magnetic core layer being arranged on the board;

a driving circuit configured to output an AC current to the excitation coil; and a detection circuit configured to acquire a detection signal from the signal coil, wherein a first axis sensor unit is constituted by at least two magnetic sensors out of the plurality of magnetic sensors, the at least two magnetic sensors being each arranged such that a detection direction thereof is aligned with a first axial direction, and wherein a second axis sensor unit is constituted by at least one magnetic sensor out of the plurality of magnetic sensors, the at least one magnetic sensor being arranged such that a detection direction thereof is aligned with a second axial direction intersecting with the first axial direction.

In the magnetic detection device according to the above-described one aspect of the present invention, the first axis sensor unit is constituted by at least two magnetic sensors out of the plurality of magnetic sensors arranged, the at least two magnetic sensors being arranged such that the detection direction thereof is aligned with a first axial direction, and the second axis sensor unit is constituted by at least one magnetic sensor out of the plurality of magnetic sensors, the at least one magnetic sensor being arranged so that a detection direction thereof is aligned with a second axial direction intersecting with the first axial direction.

With this configuration, in the first axis sensor unit, the magnetic field in the first axial direction is detected by the at least two magnetic sensors, and in the second axis sensor unit, the magnetic field in the second axial direction is detected by the at least one magnetic sensor. Therefore, as compared with the case where magnetic fields in a plurality of directions are detected collectively by a single magnetic sensor, it is possible to suppress the decrease in sensitivity.

Further, the first axis sensor unit is constituted by the at least two magnetic sensors, and the second axis sensor unit is constituted by the at least one magnetic sensor. Therefore, by arranging the center of the magnetic sensor of the second axis sensor unit between the at least two magnetic sensors of the first axis sensor unit, the centers of the at least two magnetic sensors of the first axis sensor unit and the center of the magnetic sensors of the second axis sensor unit can be brought closer.

Therefore, in the case of detecting magnetic fields in a plurality of directions, it is possible to bring the detection positions in a plurality of directions closer to each other. As a result, in the case of detecting magnetic fields in a plurality of directions, it is possible to bring the detection positions for each magnetic field in a plurality of directions closer to each other while suppressing the reduction in sensitivity.

BRIEF DESCRIPTION OF THE DRAWINGS

The preferred embodiments of the present invention are shown by way of example, and not limitation, in the accompanying figures.

DETAILED DESCRIPTION OF THE PREFERRED EMBODIMENTS

Hereinafter, some embodiments in which the present invention is embodied will be described with reference to the attached drawings.

First Embodiment

Referring to FIG. 1 to FIG. 4, an entire configuration of a magnetic detection device 100 according to a first embodiment of the present invention will be described.

(Configuration of Magnetic Detection Device)

Figure 1:
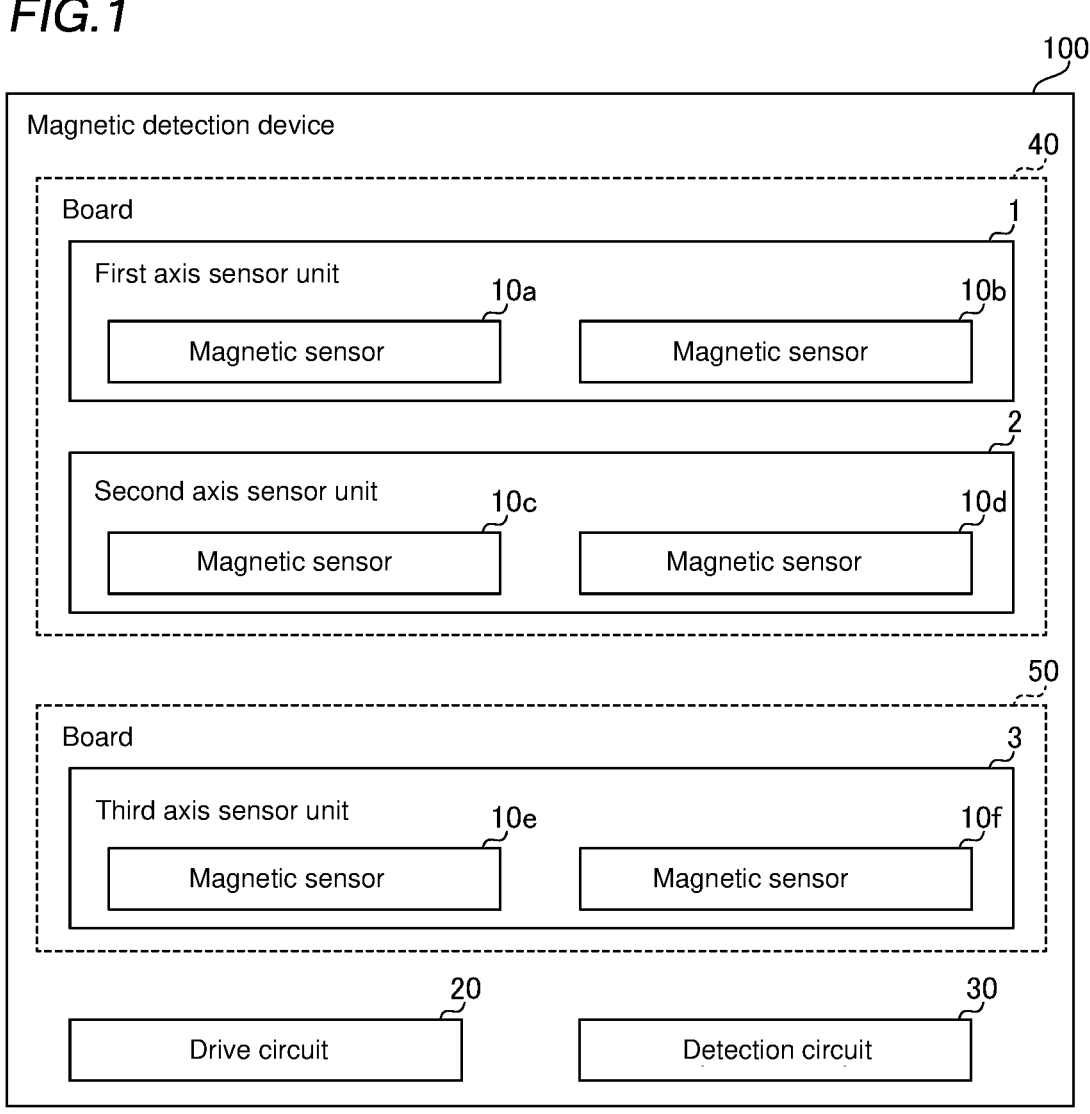
FIG. 1 is a block diagram showing an entire configuration of a magnetic detection device according to a first embodiment of the present invention.

As shown in FIG. 1, the magnetic detection device 100 according to the first embodiment is provided with a plurality of magnetic sensors, i.e., a magnetic sensor 10a, a magnetic sensor 10b, a magnetic sensor 10c, a magnetic sensor 10d, a magnetic sensor 10e, and a magnetic sensor 10f. Further, the magnetic detection device 100 is provided with a driving circuit 20 and a detection circuit 30. The magnetic detection device 100 is a three-axis magnetic sensor that detects each of magnetic fields (magnetic fluxes) in three axial directions.

In the magnetic detection device 100, the first axis sensor unit 1 is constituted by two magnetic sensors 10a and 10b out of the plurality of magnetic sensors 10a to 10f. Further, the second axis sensor unit 2 is constituted by two magnetic sensors 10c and 10d out of the plurality of magnetic sensors 10a to 10f. Further, the third axis sensor unit 3 is constituted by two magnetic sensors 10e and 10f out of the plurality of magnetic sensors 10a to 10f.

That is, the number of magnetic sensors 10a and 10b in the first axis sensor unit 1, the number of magnetic sensors 10c and 10d in the second axis sensor unit 2, and the number of magnetic sensors 10e and 10f in the third axis sensor unit 3 are equal to each other.

Figure 2:
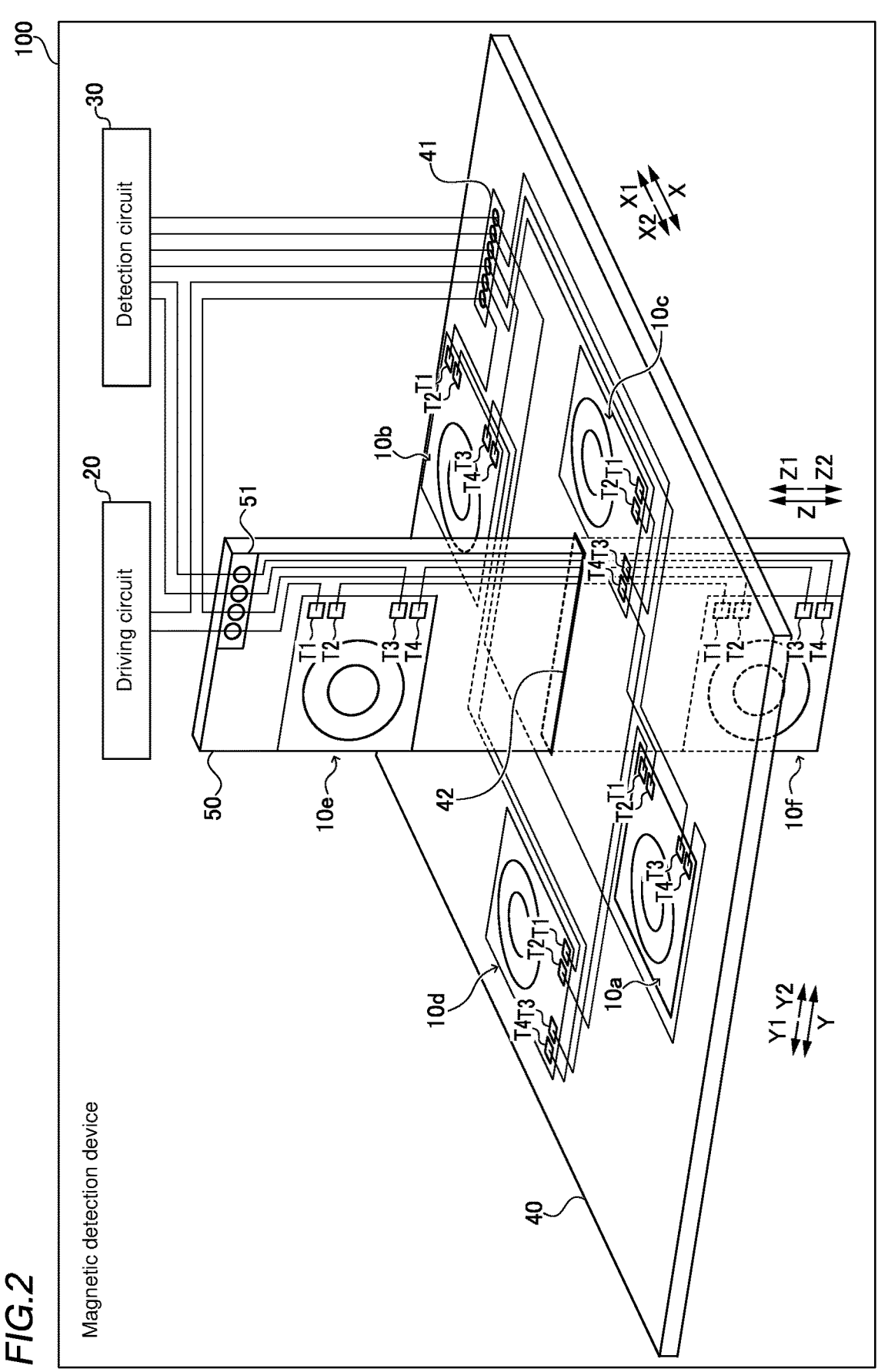
FIG. 2 is a perspective view showing a schematic configuration of the magnetic detection device according to the first embodiment.

As shown in FIG. 2, in the first axis sensor unit 1, the magnetic sensor 10a and the magnetic sensor 10b are arranged so that the detection directions thereof are aligned with the X-direction, which is a first axial direction. In the second axis sensor unit 2, the magnetic sensor 10c and the magnetic sensor 10d are arranged so that the detection directions thereof are aligned with the Y-direction, which is a second axial direction. In the third axis sensor unit 3, the magnetic sensor 10e and the magnetic sensor 10f are arranged such that the detection directions thereof are aligned with the Z-direction, which is a third axial direction.

The second axial direction is a direction intersecting with the first axial direction. The third axial direction is a direction intersecting with the plane (XY plane) formed by the first axial direction and the second axial direction. Specifically, the first axial direction (X-direction), the second axial direction (Y-direction), and the third axial direction (Z-direction) are orthogonal to each other.

The magnetic sensors 10a and the magnetic sensors 10b of the first axis sensor unit 1 and the magnetic sensors 10c and the magnetic sensors 10d of the second axis sensor unit 2 are arranged on the board 40 along the XY plane. The magnetic sensor 10e and the magnetic sensor 10f of the third axis sensor unit 3 are arranged on the board 50 along the YZ plane.

Note that the board 40 is one example of the "board" and the "first board" recited in claims. Also note that the board 50 is one example of the "board" and the "second board" recited in claims. The details of the arrangements of the magnetic sensors 10a to 10f in the board 40 and the board 50 are described below.

<Magnetic Sensor>

Each of the plurality of magnetic sensors, i.e., the magnetic sensor 10a, the magnetic sensor 10b, the magnetic sensor 10c, the magnetic sensor 10d, the magnetic sensor 10e, and the magnetic sensor 10f, is a fluxgate magnetic sensor. Each of the plurality (six) of magnetic sensors, i.e., the magnetic sensor 10a, the magnetic sensor 10b, the magnetic sensor 10c, the magnetic sensor 10d, the magnetic sensor 10e, and the magnetic sensor 10f, has a common configuration. In the following description, the configuration of the magnetic sensor 10a arranged on the board 40, out of the six magnetic sensors 10a to 10f, which is arranged on the board 40, is illustrated and explained, and the configurations of the magnetic sensors 10b to 10f will not be illustrated.

Figure 3:
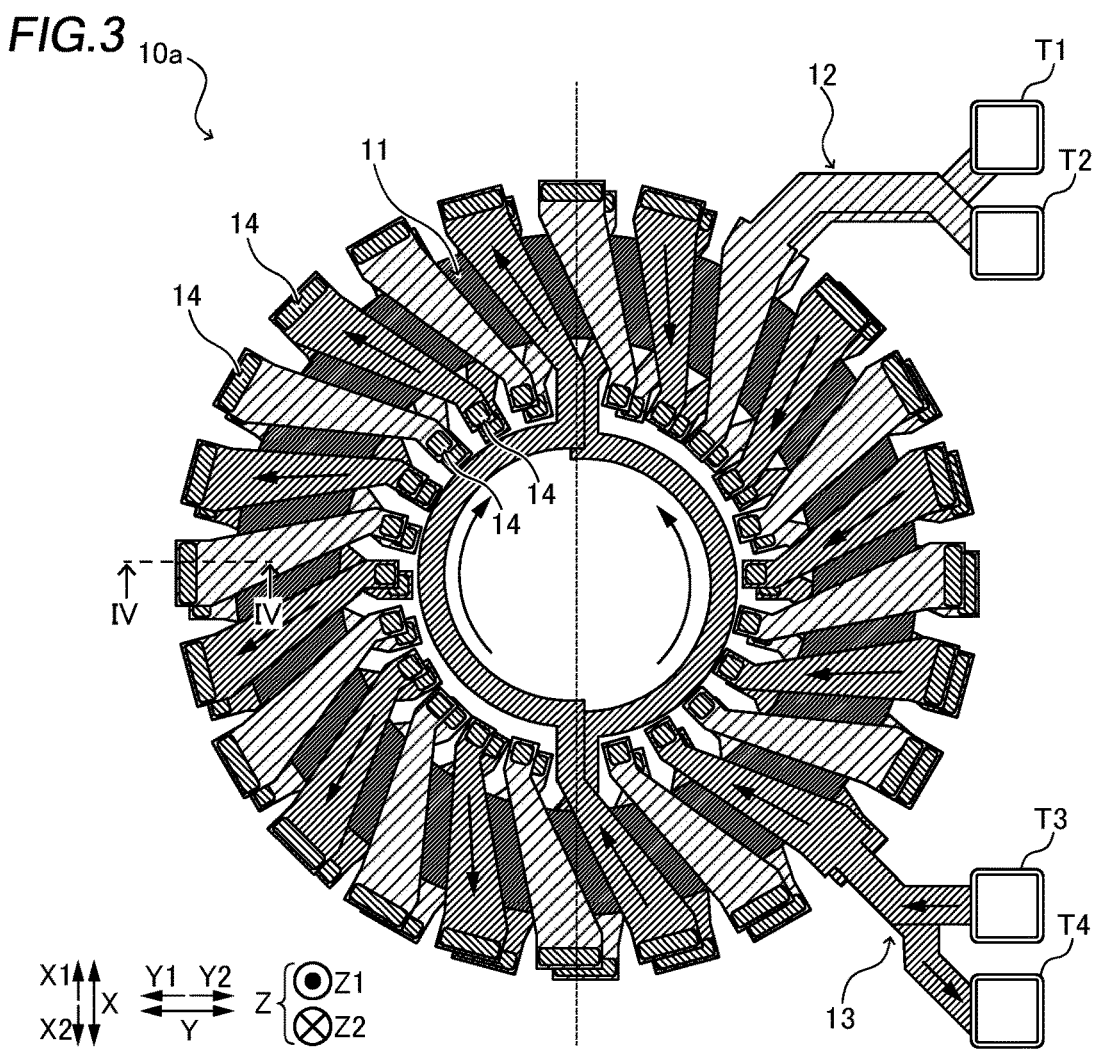
FIG. 3 is a schematic diagram showing a structure of one of the plurality of magnetic sensors.

As shown in FIG. 3, the magnetic sensor 10a includes a ring core 11, an excitation coil 12, and a signal coil 13. The ring core 11, the excitation coil 12, and the signal coil 13 are arranged on the board 40 (see FIG. 1 and FIG. 2). Note that in FIG. 3, the ring core 11, the excitation coil 12, and the signal coil 13 are distinguishably illustrated by differentiating the hatching. Further note that the ring core 11 is one example of the "magnetic core layer" recited in claims.

The ring core 11 has a circular shape. In the magnetic sensor 10a, the ring core 11 is arranged along the main surface of the board 40 as a layer formed on the board 40. In other words, the ring core 11 is formed as a thin magnetic body layer on the board 40. The ring core 11 is made of a soft magnetic material forming a magnetic path serving as a magnetic flux path. The ring core 11 is, for example, a permalloy thin film. The ring core 11 is formed in a circular shape, for example, by sputter deposition and etching on the board 40.

Note that the ring core 11 may be made of, in addition to the above-described permalloy thin film, a supermalloy containing Fe (iron), Ni (nickel), Mo (molybdenum), etc., an amorphous material containing Co (cobalt), Fe, etc., or a randomly oriented amorphous alloy by partially crystallizing it into a nanocrystalline material, etc.

Further, the excitation coil 12 and the signal coil 13 are arranged along the circumferential direction of the circular ring core 11 while alternately winding around the ring core 11. The signal coil 13 is arranged by reversing the winding direction on the ring core 11 every half circumference of the ring core 11. In the magnetic sensor 10a, the signal coil 13 is wound in different directions from each other on the Y1-direction side and the Y2-direction side with respect to the center of the ring core 11. The winding of the signal coil 13 (the winding direction) is indicated by arrows in the figure. In the signal coil 13, on the Y1-direction side, it is wound from the radially inner side of the ring core 11 to the radially outer side of the ring core 11 on the Z1-direction side. On the other hand, on the Y2-direction side of the signal coil 13, it is wound from the radially outer side of the ring core 11 to the radially inner side of the ring core 11 on the Z1-direction side. The signal coil 13 is in a differentially connected state in which the Y1-direction side portion and the Y2-direction side portion are differentiated in polarity from each other. Therefore, in the magnetic sensor 10a, the line passing through the center of the ring core 11 along the X-direction is the sensitivity axis.

In other words, in the magnetic sensor 10a, the X-direction (first axial direction), which is a direction of the position where the winding direction of the signal coil 13 is reversed on the ring core 11, is the detection direction. In other words, in each of the plurality of magnetic sensors 10a to 10f, the one side portion and the other side portion in a direction orthogonal to the detection direction are in a differentially connected state with respect to each other.

Further, the excitation coil 12 is connected to the driving circuit 20 via the terminals T1 and T2. Further, the signal coil 13 is connected to the detection circuit 30 via the terminals T3 and T4.

Figure 4:
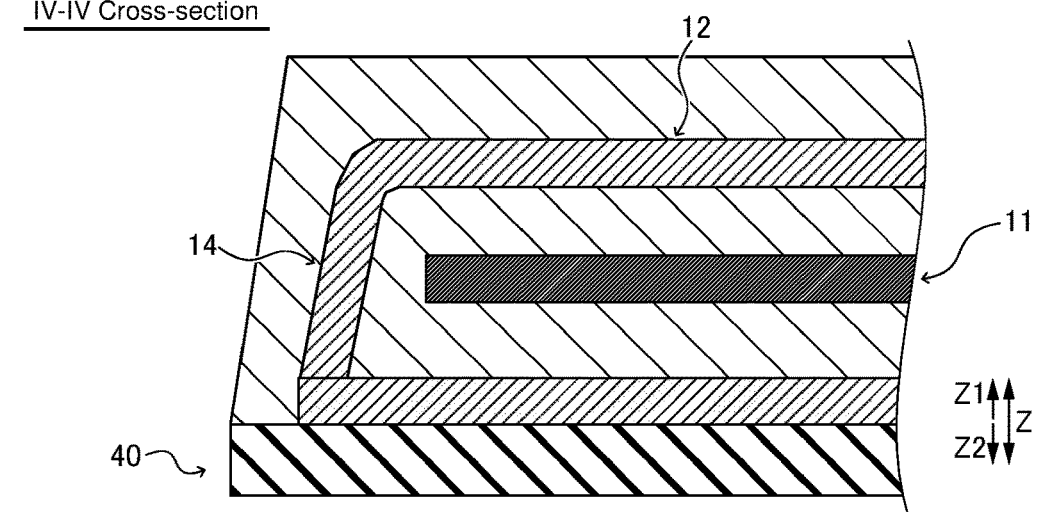
FIG. 4 is a cross-sectional view taken along the line IV-IV in FIG. 3.

As shown in FIG. 4, in the magnetic sensor 10a, the excitation coil 12 and the signal coil 13 are each formed as a thin-film conductor pattern on the board 40. FIG. 4 is a cross-sectional view taken along the line IV-IV in FIG. 3 and therefore shows the cross-section of the excitation coil 12, and the structure of the signal coil 13 is also similar. The excitation coil 12 and the signal coil 13 are arranged on the board 40 so as to wind around the ring core 11 by connecting the conductor pattern formed on one side (Z1-direction side) in the direction (thickness direction) intersecting with the main surface of the board 40 and the conductor pattern formed on the other side (Z2-direction side) so as to sandwich the ring core 11 with one another.

For example, in the magnetic sensor 10a, the excitation coil 12 and the signal coil 13 are connected to each other with the conductor patterns formed on the Z1-direction side and the Z2-direction side connected via contact holes (portions 14 in FIG. 3 and FIG. 4). The excitation coil 12 and the signal coil 13 are formed, for example, by copper pattern plating. In the board 40, after the Z2-direction side conductor patterns of the excitation coil 12 and the signal coil 13 are formed, the layer of the ring core 11 is formed after the insulating film is arrangged. Thereafter, an insulation film is arranged again, and then the conductor patterns and the conductors of the contact holes on the Z1-direction side of the excitation coil 12 and the signal coil 13 are formed. As described above, the excitation coil 12 and the signal coil 13 are arranged so as to wind around the ring core 11 three-dimensionally.

In FIG. 3, the portions 14 connecting the Z1-direction side conductor pattern and the Z2-direction side conductor pattern of the excitation coil 12 and the signal coil 13 to each other are shown in a shifted state, as viewed from the Z-direction side. However, the portion 14 connecting the Z1-direction side conductor pattern and the portion connecting the Z2-direction side conductor pattern to each other may be arranged so as to overlap each other as viewed from the Z-direction side.

Each of the plurality of magnetic sensors 10a to 10f individually includes a ring core 11, an excitation coil 12, and a signal coil 13. In other words, each of the plurality of magnetic sensors 10a to 10f is a sensor independent for each ring core 11. In each of the magnetic sensors 10a to 10d out of the plurality of magnetic sensors 10a to 10f, the ring core 11, the excitation coil 12, and the signal coil 13 are arranged on the board 40 (see FIG. 1 and FIG. 2). In the magnetic sensors 10e and 10f, the ring core 11, the excitation coil 12, and the signal coil 13 are arranged on the board 50.

In other words, each of the excitation coil 12 and the signal coil 13 of the magnetic sensor 10a and the magnetic sensor 10b in the first axis sensor unit 1 and each of the excitation coil 12 and the signal coil 13 of the magnetic sensor 10c and the magnetic sensor 10d in the second axis sensor unit 2 are formed on a common board 40 as a conductor pattern. The excitation coil 12 and the signal coil 13 of each of the magnetic sensor 10e and the magnetic sensor 10f in the third axis sensor unit 3 are formed as conductor patterns on the board 50, which is separate from the board 40.

The structures of the ring core 11, the excitation coil 12, and the signal coil 13 of the magnetic sensors 10b to 10f in each of the boards 40 and 50 are the same as those of the ring core 11, the excitation coil 12, and the signal coil 13 of the magnetic sensor 10a in the board 40.

Further, the excitation coil 12 of each of the plurality of magnetic sensors 10a to 10f has a common winding number. In the same manner, the signal coil 13 of each of the plurality of magnetic sensors 10a to 10f has a common winding number. Each of the plurality of magnetic sensors 10a to 10d has a flat shape whose size in the direction (Z-direction) intersecting with the main surface of the board 40 is smaller than the size in the direction (direction along the XY plane) along the main surface of the board 40. The plurality of magnetic sensors 10e and 10f also have a flat shape with a smaller size in the direction (X-direction: see FIG. 2) intersecting with the main surface of the board 50 than in the direction (the direction along the YZ plane) along the main surface of the board 50.

As shown in FIG. 2, the driving circuit 20 is connected to the terminals T1 and T2 of each of the plurality of magnetic sensors 10a to 10f. The driving circuit 20 outputs an AC current to the excitation coil 12. The driving circuit 20 includes, for example, an oscillator and outputs an excitation current, which is an AC current of a predetermined fre- quency, to the excitation coil 12 via the terminals T1 and T2. The excitation current is, for example, an AC current of a triangular wave. The magnitude of the excitation current is large enough to saturate the magnetic field generated in the ring core 11 of each of the plurality of magnetic sensors 10a to 10f by the excitation current.

Further, the detection circuit 30 is connected to the terminal T3 and the terminal T4 of each of the plurality of magnetic sensors 10a to 10f. The detection circuit 30 is configured to acquire a detection signal from the signal coil 13 via the terminals T3 and T4. In each of the plurality of magnetic sensors 10a to 10f, the ring core 11 is periodically saturated in magnetic flux while alternately reversing the polarity, by the AC current (excitation current) passed through the excitation coil 12. In the signal coil 13, an induced electromotive force is generated at the timing when the polarity of the ring core 11 is switched. In the signal coil 13, at the timing at which the magnetic flux is saturated in the ring core 11, no induced electromotive force is generated because the magnetic flux does not change. Therefore, in the signal coil 13, a pulse signal electromotive force that alter- nately switches directions (polarities) with a period twice as long as the AC current flowing through the excitation coil 12 is generated.

Here, in the signal coil 13, the one side portion and the other side portion in the direction orthogonal to the detection direction are differentially connected in opposite polarity, so that in the absence of an external magnetic field (magnetic field), the induced electromotive forces generated in the signal coil 13 cancel each other. In this case, the detection signal output from the signal coil 13 is zero. On the other hand, when an external magnetic field along the detection direction is input, the timing at which the magnetic flux in the ring core 11 saturates differs from each other between the one side portion and the other side portion in a direction orthogonal to the detection direction.

Specifically, it becomes a state in which a magnetic field of a DC component is applied to the ring core 11 from the outside, and therefore, the timing at which induced electro- motive force is generated on one side and the other side of the direction orthogonal to the detection direction of the signal coil 13 changes so ast to differ from each other depending on the magnitude of the magnetic field from the outside. Although one side of the signal coil 13 and the other side of the signal coil 13 differ in polarity from each other, the induced electromotive forces do not cancel out each other due to the different timings, which generates a voltage signal having twice the frequency of the excitation current as the detection signal that detects the magnetic field in the detection direction.

The detection circuit 30 has, for example, a synchronous rectifier and an integrator. The detection circuit 30 synchro- nously rectifies the detection signal generated in the signal coil 13 and then integrates it to output a detection value corresponding to the magnitude of the external magnetic field input in the detection direction of each of the plurality of magnetic sensors 10a to 10f. The driving circuit 20 and the detection circuit 30, for example, are configured in a common hybrid IC (HIC). The driving circuit 20 and the detection circuit 30 may be arranged on the board 40 or the board 50, or they may be arranged at locations different from the board 40 and the board 50.

In the magnetic detection device 100, for example, an AC current (excitation current) is output from the driving circuit 20 based on a signal from the control unit, which is not illustrated, and includes an arithmetic unit such as a CPU (Central Processing Unit), and a signal indicating a detection value corresponding to the magnitude of the external mag- netic field based on the detection signal from the detection circuit 30 is output to the control unit. The detection value acquired by the control unit is displayed on a display unit, such as a display monitor, which is not illustrated.

<Connection Between a Plurality of Magnetic Sensors>

As shown in FIG. 2, in the first embodiment, the excita- tion coils 12 in each of the plurality of magnetic sensors 10a to 10f are connected in series in the forward direction with equal polarity. Specifically, the excitation coils 12 of the magnetic sensors 10a and 10b in the first axis sensor unit 1, the excitation coils 12 of the magnetic sensors 10c and 10d in the second axis sensor unit 2, and the excitation coils 12 of the magnetic sensors 10e and 10f in the third axis sensor unit 3 are connected in series with each other, and an AC current from a common driving circuit 20 is input to them. For example, the driving circuit 20 is connected to the terminal T1 of the magnetic sensor 10e via the connector 51 on the board 50.

The terminal T2 of the magnetic sensor 10e is connected to the terminal T1 of the magnetic sensor 10f, and the terminal T2 of the magnetic sensor 10f is connected to the terminal T1 of the magnetic sensor 10b via the connector 51 and the connector 41 on the board 40. The terminal T2 of the magnetic sensor 10b is connected to the terminal T1 of the magnetic sensor 10d.

Similarly, the terminal T2 of the magnetic sensor 10d and the terminal T1 of the magnetic sensor 10a are connected to each other, and the terminal T2 of the magnetic sensor 10a and the terminal T1 of the magnetic sensor 10c are con- nected to each other. The terminal T2 of the magnetic sensor 10c is connected to the driving circuit 20 via a connector 41. Thus, the excitation coil 12 in each of the magnetic sensors 10a to 10f are connected in series to the driving circuit 20 in the order of the magnetic sensor 10e, the magnetic sensor 10f, the magnetic sensor 10b, the magnetic sensor 10d, the magnetic sensor 10a, and the magnetic sensor 10c.

With this, in the excitation coil 12 of each of the plurality of magnetic sensors 10a to 10f, each of the period, the phase, and the polarity of the AC current to be flowed is common to each other. Thus, in each of the plurality of magnetic sensors 10a to 10f, an oscillating magnetic flux with a common period, phase, and polarity is produced in the ring core 11.

The signal coils 13 of the plurality of magnetic sensors 10a to 10f are connected in series in the forward direction with each other for each of the first axis sensor unit 1, the second axis sensor unit 2, and the third axis sensor unit 3. In other words, in the first axis sensor unit 1, the terminal T3 of the magnetic sensor 10a is connected to the detection circuit 30 via the connector 41, and the terminal T4 of the magnetic sensor 10a and the terminal T3 of the magnetic sensor 10b are connected to each other. The terminal T4 of the magnetic sensor 10b is connected to the detection circuit 30 via the connector 41.

Similarly, in the second axis sensor unit 2, the terminal T3 of the magnetic sensor 10c is connected to the detection circuit 30 via the connector 41, and the terminal T4 of the magnetic sensor 10*c* and the terminal T3 of the magnetic sensor 10*d* are connected to each other. And the terminal T4 of the magnetic sensor 10*d* is connected to the detection circuit 30 via the connector 41. Similarly, in the third axis sensor unit 3, the terminal T3 of the magnetic sensor 10*e* is connected to the detection circuit 30 via the connector 51, and the terminal T4 of the magnetic sensor 10*e* and the terminal T3 of the magnetic sensor 10*f* are connected to each other. And, the terminal T4 of the magnetic sensor 10*f* is connected to the detection circuit 30 via the connector 51.

In other words, the detection signal from each of the signal coils 13 of the plurality of magnetic sensors 10*a* to 10*f* is detected by the common detection circuit 30 collectively for each detection direction. When viewed from the detection circuit 30, the signal coil 13 of each of the plurality of magnetic sensors 10*a* to 10*f* is considered to be similar to a single coil for each detection direction.

Note that the S/N ratio (signal-to-noise ratio) is improved by connecting the plurality of signal coils 13 in series with each other for each axis. For example, in the case where the two signal coils 13 are connected in series with each other, the intensity of the detection signal is doubled, but the intensity of the noise signal is √2 times greater, and therefore the S/N rati mproves by √2-times.

<Arrangement of Magnetic Sensors on a Board>

In the first embodiment, the two magnetic sensors 10*a* and 10*b* in the first axis sensor unit 1 are arranged with the detection directions aligned along the main surface of the board 40 so that the detection directions are in the common first axial direction (X-direction). The two magnetic sensors 10*c* and 10*d* in the second axis sensor unit 2 are arranged with the detection directions along the main surface of the board 40 so that the detection directions are in the common second axial direction (Y-direction). The two magnetic sensors 10*e* and 10*f* in the third axis sensor unit 3 are arranged with the detection directions aligned along the main surface of the board 50 so that the detection directions are in the common third axial direction (Z-direction).

Specifically, the magnetic sensors 10*a* and 10*b* of the first axis sensor unit 1 are arranged side by side along the first axial direction (X-direction) along the main surface of the board 40. The magnetic sensors 10*c* and 10*d* of the second axis sensor unit 2 are arranged side by side along the second axial direction (Y-direction) along the main surface of the board 40 common to the first axis sensor unit 1. The magnetic sensors 10*e* and 10*f* of the third axis sensor unit 3 are arranged side by side along the third axial direction (Z-direction) along the main surface of the board 50. In other words, the magnetic sensors 10*a* and 10*b* of the first axis sensor unit 1 are arranged along the first axial direction (X-direction), which is the detection direction, so that they have a common sensitivity axis with each other.

Similarly, the magnetic sensor 10*c* and the magnetic sensor 10*d* of the second axis sensor unit 2 are arranged along the second axial direction (Y-direction), which is the detection direction, so that they have a common sensitivity axis with each other. The magnetic sensor 10*e* and the magnetic sensor 10*f* of the third axis sensor unit 3 are arranged along the third axial direction (Z-direction), which is the detection direction, so that they have a common sensitivity axis with each other.

Further, the magnetic sensor 10*a* and the magnetic sensor 10*b* of the first axis sensor unit 1 and the magnetic sensor 10*c* and the magnetic sensor 10*d* of the second axis sensor unit 2 are arranged in a cross shape on the common board 40 so that the line connecting the two magnetic sensors 10*a* and

10*b* of the first axis sensor unit 1 and the line connecting the magnetic sensors 10*c* and 10*d* of the second axis sensor unit 2 intersect perpendicularly with each other. The center position between the magnetic sensors 10*a* and 10*b* of the first axis sensor unit 1 and the center position between the magnetic sensors 10*c* and 10*d* of the second axis sensor unit 2 coincide with each other. The magnetic sensors 10*a* and 10*b* of the first axis sensor unit 1 and the magnetic sensors 10*c* and 10*d* of the second axis sensor unit 2 are arranged on the common board 40 so that their sensitivity axes intersect orthogonally with each other.

The magnetic sensors 10*e* and 10*f* in the third axis sensor unit 3 are arranged on the axis line passing between two of the magnetic sensor 10*a* and the magnetic sensor 10*b* in the first axis sensor unit 1. Specifically, the board 40 is in a rectangular shape along the XY plane. Each of the plurality of magnetic sensors 10*a* to 10*d* is arranged in the center of each side of the board 40. In the board 40, a hole 42 is provided in the center portion. The board 50 is arranged along the YZ plane so as to penetrate the hole 42.

The board 50 is arranged such that the center position between the magnetic sensors 10*e* and 10*f* of the third axis sensor unit 3 coincide with the center position between magnetic sensors 10*a* and 10*b* of the first axis sensor unit 1 and the center position between the magnetic sensors 10*c* and 10*d* of the second axis sensor unit 2. In other words, the board 40 on which the first axis sensor unit 1 and the second axis sensor unit 2 are arranged is arranged at the position between the magnetic sensors 10*e* and 10*f* of the third axis sensor unit 3.

The sensitivity axis of the magnetic sensors 10*e* and 10*f* of the third axis sensor unit 3 is arranged to be orthogonal to the sensitivity axis of the magnetic sensors 10*a* and 10*b* of the first axis sensor unit 1 and the sensitivity axis of the magnetic sensors 10*c* and 10*d* of the second axis sensor unit 2. That is, the sensitivity axes of the first axis sensor unit 1, the second axis sensor unit 2, and the third axis sensor unit 3 intersect each other orthogonally at a single point (center position).

Each of the plurality of magnetic sensors 10*a* to 10*f* is arranged at an equal distance from the center position where the sensitivity axes intersect orthogonally to each other. In other words, the distance between the centers of the ring cores 11 of the magnetic sensors 10*a* and 10*b* of the first axis sensor unit 1, the distance between the centers of the ring cores 11 of the magnetic sensors 10*c* and 10*d* of the second axis sensor unit 2, and the distance between the centers of the ring cores 11 of the magnetic sensors 10*e* and 10*f* of the third axis sensor unit 3 are approximately equal in size.

Note that the conductors connecting the plurality of magnetic sensors 10*a* to 10*d* on the board 40 may be formed as conductor patterns on the board 40. In such a case, the conductor pattern forming the excitation coil 12 and the signal coil 13 and the conductor pattern of the board 40 may be formed integrally, or the conductor pattern of the board 40 and the terminals T1 to T4 of the plurality of magnetic sensors 10*a* to 10*d* may be electrically connected to each other by soldering a conductor wire (lead wire) or the like.

Further, the terminals T1 to T4 of each of the plurality of magnetic sensors 10*a* to 10*d* may be electrically connected to the conductor pattern of the board 40 by using a wire bonding method. The same is applied to the conductors connecting the plurality of magnetic sensors 10*e* and 10*f* on the board 50.

Effects of First Embodiment

In this first embodiment, the following effects can be obtained.

In the first embodiment, as described above, it is configured as follows. The first axis sensor unit 1 is constituted by at least two magnetic sensors 10*a* and 10*b* out of the plurality of magnetic sensors 10*a* to 10*f*, the at least two magnetic sensors 10*a* to 10*b* being arranged such hat the first axial direction (X-direction) is the detection direction. The second axis sensor unit 2 is constituted by at least one magnetic sensors 10*c* and 10*d* out of the plurality of magnetic sensors 10*a* to 10*f*, the at least one magnetic sensors 10*c* an 10*d* being arranged such that the second axial direction (Y-direction), which intersects the first axial direction (X-direction), is the detection direction.

With this, in the first axis sensor unit 1, the magnetic field in the first axial direction (X-direction) is detected by the at least two magnetic sensors 10*a* and 10*b*, and in the second axis sensor unit, the magnetic field in the second axial direction (Y-direction) is detected by the at least one magnetic sensor 10*c* and 10*d*. Therefore, as compared with the case where magnetic fields in a plurality of directions are collectively detected by a single magnetic sensor, it is possible to suppress the decrease in sensitivity.

Further, the first axis sensor unit 1 constituted by the at least two magnetic sensors 10*a* and 10*b*, and the second axis sensor unit 2 is constituted by the at least one magnetic sensor 10*c* and 10*d*. Therefore, by arranging the centers of the magnetic sensors 10*c* and 10*d* of the second axis sensor unit 2 between the at least two magnetic sensors 10*a* and 10*b* of the first axis sensor unit 1, the centers of the at least two magnetic sensors 10*a* and 10*b* of the first axis sensor unit 1 and the centers of the magnetic sensors 10*c* and 10*d* of the second axis sensor unit 2 can be brought closer together.

Therefore, in the case of detecting magnetic fields in a plurality of directions, it is possible to bring the detection positions for each magnetic field in a plurality of directions closer to each other. As a result, in the case of detecting magnetic fields in a plurality of directions, it is possible to bring the detection positions for each of the magnetic fields in the plurality of directions closer to each other while suppressing the reduction in sensitivity.

Further, in the above-described first embodiment, the following further effects can be obtained by configuring as follows.

That is, in the first embodiment, as described above, the third axis sensor unit 3 is constituted by at least one of the magnetic sensors 10*e* and 10*f* out of the plurality of magnetic sensors 10*a* to 10*f*, the at least one of the magnetic sensors 10*e* and 10*f* being is arranged such that the third axial direction (Z-direction), which intersects the plane formed by the first axial direction (X-direction) and the second axial direction (Y-direction) (the XY plane), is the detection direction. The magnetic sensors 10*e* and 10*f* in the third axis sensor unit 3 are arranged on the axis line passing between the at least two magnetic sensors 10*a* and 10*b* in the first axis sensor unit 1.

By configuring as described above, since the magnetic sensors 10*e* and 10*f* in the third axis sensor unit 3 are arranged on the axis line passing between the at least two magnetic sensors 10*a* and 10*b* in the first axis sensor unit 1, it is possible to bring the positions of the centers of the at least two magnetic sensors 10*a* and 10*b* in the first axis sensor unit 1 and the positions of the centers of the magnetic sensors 10*e* and 10*f* in the third axis sensor unit 3 closer to each other. For this reason, even in the case of detecting magnetic fields in the three directions, i.e., the first axial direction, the second axial direction, and the third axial direction, the detection positions for each of the magnetic fields in the three directions can be brought closer to each other.

Further, in the first embodiment, as described above, the number of the magnetic sensors 10*c* and 10*d* in the second axis sensor unit 2 is equal to the number of the magnetic sensors 10*a* and 10*b* in the first axis sensor unit 1.

By configuring as described above, it is possible to make the detection sensitivity of the magnetic field in the first axis sensor unit 1 and the detection sensitivity of the magnetic field in the second axis sensor unit 2 equal to each other. Therefore, in the case of detecting the magnetic fields in two directions, i.e., the first axial direction (X-direction) and the second axial direction (Y-direction), it is possible to bring the detection positions for each of the magnetic fields in the two directions closer while suppressing the difference in sensitivity in each of the two directions.

In the first embodiment, as described above, the excitation coil 12 and the signal coil 13 of the magnetic sensors 10*a* and 10*b* in the first axis sensor unit 1 and the excitation coil 12 and the signal coil 13 of the magnetic sensors 10*c* and 10*d* in the second axis sensor unit 2 are formed as a conductor pattern on the same board 40 (first board).

By configuring as described above, it is possible to easily arrange the magnetic sensors 10*a* and 10*b* of the first axis sensor unit 1 and the magnetic sensors 10*c* and 10*d* of the second axis sensor unit 2 on a common plane by arranging them on the common board 40. Therefore, as compared with the case in which the first axis sensor unit and the second axis sensor unit are arranged on different boards, the number of parts can be reduced, and the detection positions for the magnetic fields in the two directions, i.e., the first axial direction (X-direction) and the second axial direction (Y-direction), can be easily brought closer to each other.

Further, in the first embodiment, as described above, the second axis sensor unit 2 is composed of the at least two magnetic sensors 10*c* and 10*d*. The third axis sensor unit 3 is composed of the at least one magnetic sensor 10*e*, 10*f* out of the plurality of magnetic sensors 10*a* to 10*f*, the at least one magnetic sensor 10*e*, 10*f* being arranged such that the third axial direction (Z-direction), which intersects the plane (XY plane) formed by the first axial direction (X-direction) and the second axial direction (Y-direction), is the detection direction. The excitation coil 12 and the signal coil 13 of the magnetic sensors 10*e* and 10*f* in the third axis sensor unit 3 are formed as a conductor pattern on the board 50 (second board), which is a board separate from the board 40 (first board). The board 50 is arranged to penetrate the hole 42 in the board 40.

By configuring as described above, the board 50 on which the third axis sensor unit 3 is arranged is arranged to penetrate the hole 42 in the board 40 on which the first axis sensor unit 1 and the second axis sensor unit 2 are arranged. Therefore, the positions of the magnetic sensors 10*e* and 10*f* in the third axis sensor unit 3 can be brought closer with respect to the positions of the center of the at least two magnetic sensors 10*a* and 10*b* in the first axis sensor unit 1 and the positions of the centers of the at least two magnetic sensors 10*c* and 10*d* in the second axis sensor unit 2. Therefore, even in the case of detecting magnetic fields in three directions, i.e., the first axial direction, the second axial direction, and the third axial direction, the detection positions for the three magnetic fields can be brought closer to each other.

In the first embodiment, as described above, the first axis sensor unit 1 is composed of two magnetic sensors 10a and 10b, which are arranged side by side along the first axial direction (X-direction). The second axis sensor unit 2 is composed of two magnetic sensors 10c and 10d, which are arranged side by side along the second axial direction (Y-direction). The two magnetic sensors 10a and 10b in the first axis sensor unit 1 and the two magnetic sensors 10c and 10d in the second axis sensor unit 2 are arranged in a cross shape such that the line connecting the two magnetic sensors 10a and 10b in the first axis sensor unit 1 and the line connecting the two magnetic sensors 10c and 10d in the second axis sensor unit 2 intersect perpendicularly.

By configuring as described above, in the first axis sensor unit 1, two magnetic sensors 10a and 10b are arranged side by side along the first axial direction, which is the detection direction, and in the second axis sensor unit 2, two magnetic sensors 10c and 10d are arranged side by side along the second axial direction, which is the detection direction. Therefore, in each of the first axis sensor unit 1 and the second axis sensor unit 2, the sensibility for each axis can be improved in a state in which the sensitivity axis for each axis is common. Further, the two magnetic sensors 10a and 10b in the first axis sensor unit 1 and the two magnetic sensors 10c and 10d in the second axis sensor unit 2 are arranged in a cross shape so that the line connecting the two magnetic sensors 10a and 10b in the first axis sensor unit 1 and the line connecting the two magnetic sensors 10c and 10d in the second axis sensor unit 2 intersect perpendicularly. Therefore, it is possible to bring the centers of the detection positions in the first axial direction and the second axial direction closer with respect to the intersection of the cross. Therefore, it is possible to bring the detection positions in the two directions closer.

Further, in the first embodiment, as described above, the ring core 11 (magnetic core layer) has a circular shape and is arranged along the main surface of the board 40, 50 as a layer formed on the board 40, 50. The excitation coil 12 and the signal coil 13 are arranged along the circumferential direction of the circular ring core 11 so as to alternately wind around the ring core 11. The signal coil 13 is arranged while reversing the winding direction on the ring core 11 every half circumference of the ring core 11. The at least two magnetic sensors 10a and 10b in the first axis sensor unit 1 are arranged such that the detection direction which is a direction of the position where the winding direction of the signal coil 13 is reversed on the magnetic core layer is aligned with a direction of the first axial direction (X-direction) which is common to each other.

By configuring as described above, in the case of arranging the ring cores 11 as layers formed on the board 40 and the board 50, the at least two magnetic sensors 10a and 10b in the first axis sensor unit 1 are arranged with the detection direction aligned to be a common direction with each other. Therefore, in the case of arranging the plurality of magnetic sensors 10a to 10f on the board 40 and the board 50, it is possible to effectively improve the sensitivity in detecting the magnetic field in the first axial direction.

Further, in the first embodiment, as described above, the excitation coils 12 of the magnetic sensors 10a and 10b in the first axis sensor unit 1 and the excitation coils 12 of the magnetic sensors 10c and 10d in the second axis sensor unit 2 are connected in series with each other, and an AC current from the common driving circuit 20 is input to them.

By configuring as described above, as compared with the case where AC power is input to the excitation coils 12 from mutually different driving circuits in the first axis sensor unit

1 and the second axis sensor unit 2, it is possible to prevent the device configuration from becoming complicated by using the common driving circuit 20. Therefore, in the case of suppressing the reduction of the sensitivity by arranging a plurality of magnetic sensors 10a to 10f to detect magnetic fields in a plurality of directions, it is possible to suppress the device configuration from becoming more complex.

Second Embodiment

Figure 5:
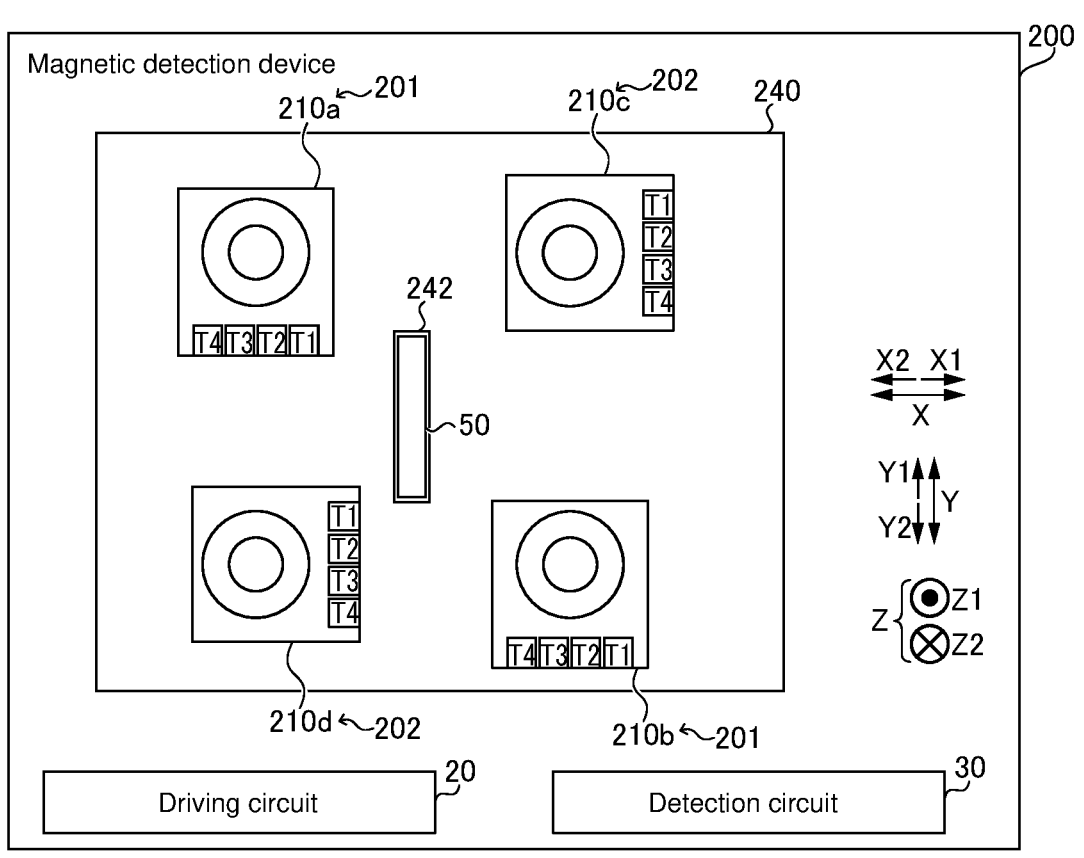
FIG. 5 is a diagram showing an entire configuration of a magnetic detection device according to a second embodiment.

Next, referring to FIG. 5, a second embodiment is described. In this second embodiment, unlike the first embodiment in which the magnetic sensors 10a and 10b of the first axis sensor unit 1 and the magnetic sensors 10c and 10d of the second axis sensor unit 2 are arranged in a cross shape, the first axis sensor unit 201 and the second axis sensor unit 202 are arranged along the diagonal lines of the rectangular board 240. Note that in the figure, the same reference symbols are assigned to the portions with the same configuration as in the above-described first embodiment. (Configuration of Magnetic Detection Device According to Second Embodiment)

As shown in FIG. 5, the magnetic detection device 200 according to the second embodiment is provided with a plurality of magnetic sensors, i.e., a magnetic sensor 210a, a magnetic sensor 210b, a magnetic sensor 210c, and a magnetic sensor 210d. Each of the magnetic sensor 210a, the magnetic sensor 210b, the magnetic sensor 210c, and the magnetic sensor 210d has a common configuration. Further, each of the magnetic sensor 210a, the magnetic sensor 210b, the magnetic sensor 210c, and the magnetic sensor 210d has the same configuration as that of each of the magnetic sensors 10a to 10f according to the first embodiment.

In the second embodiment, the first axis sensor unit 201 is composed of two of the magnetic sensors 210a and 210b. Further, the second axis sensor unit 202 is composed of two of the magnetic sensor 210a and the magnetic sensor 210d.

Each of the magnetic sensors 210a and the magnetic sensor 210b of the first axis sensor unit 201 is the same as the magnetic sensor 10a and the magnetic sensor 10b of the first axis sensor unit 1 according to the first embodiment. Each of the magnetic sensors 210c and the magnetic sensor 210d of the second axis sensor unit 202 is the same as each of the magnetic sensor 10c and the magnetic sensor 10d of the second axis sensor unit 2 according to the first embodiment.

In the second embodiment, the magnetic sensor 210a and the magnetic sensor 210b of the first axis sensor unit 201 and the magnetic sensors 210c and the magnetic sensors 210d of the second axis sensor unit 202 are arranged on the board 240. That is, in each of the magnetic sensors 210a to 210d, the ring core 11, the excitation coil 12, and the signal coil 13 are arranged on the board 240. Note that the board 240 is one example of the "board" and the "first board" recited in claims.

The board 240 has a circular shape. And in the second embodiment, the magnetic sensor 210a and the magnetic sensor 210b of the first axis sensor unit 201 and the magnetic sensors 210c and the magnetic sensors 210d of the second axis sensor unit 202 are arranged along the diagonal lines of the rectangular board 240.

In other words, in the board 240, the line connecting the centers of the magnetic sensor 210a and the magnetic sensor 210b in the first axis sensor unit 201 and the line connecting the centers of the magnetic sensor 210c and the magnetic sensor 210d in the second axis sensor unit 202 intersect perpendicularly, resulting in an X shape.

In other words, as in the first embodiment, the magnetic sensors 210a and 210b of the first axis sensor unit 201 and the magnetic sensors 210c and 210d of the second axis sensor unit 202 are arranged so that their centers coincide with each other, and their sensitivity axes are orthogonal to each other.

In the second embodiment, in the board 240, the magnetic sensor 210a and the magnetic sensor 210b of the first axis sensor unit 201 are displaced in the Y-direction from each other and are arranged so that the common X-direction (first axial direction) is the detection direction. The magnetic sensor 210c and the magnetic sensor 210d of the second axis sensor unit 202 are similarly arranged so that the common Y-direction (second axial direction) is the detection direction with mutual displaced in the X-direction.

The board 240 has a hole 242 through which the board 50 passes, similar to the board 40 of the first embodiment. The configuration of the board 50 penetrating the hole 242 is the same as in the first embodiment. In other words, two magnetic sensors 10e and 10f, which constitute the third axis sensor unit 3, are arranged on the board 50. In the same manner as in the first embodiment, the board 50 is arranged in the hole 242 so that the center position between the magnetic sensors 10e and 10f of the third axis sensor unit 3 coincide with the center positions between the magnetic sensors 210a and 210b of the first axis sensor unit 201 and the center position between the magnetic sensors 210c and 210d of the second axis sensor unit 202.

Note that the connections between each of the plurality of magnetic sensors 210a to 210d and the driving circuit 20 and the detection circuit 30 are the same as those in the first embodiment. Further, the other configuration of the magnetic detection device 200 according to the second embodiment is the same as that in the first embodiment.

Effects of Second Embodiment

In the second embodiment, the following effects can be obtained.

In the second embodiment, as described above, the first axis sensor unit 201 is composed of two of the magnetic sensors 210a and 210b. The second axis sensor unit 2 is composed of two of the magnetic sensors 210c and 210d. The board 240 (first board) has a circular shape. The two of the magnetic sensor 210a and the magnetic sensor 210b of the first axis sensor unit 201 and the two of the magnetic sensors 210c and the magnetic sensors 210d of the second axis sensor unit 202 are arranged along the diagonal lines of the rectangular board 240.

By configuring as described above, the two of the magnetic sensors 210a and 210b of the first axis sensor unit 201 and the two of the magnetic sensors 210c and 210d of the second axis sensor unit 202 are arranged along the diagonal lines of the rectangular board 240. Therefore, it is possible to suppress the region where the four magnetic sensors 210a to 210d are arranged on the board 240 from becoming large. For this reason, when arranging two magnetic sensors 210a and 210b (210c and 210d) in each of the first axis sensor unit 201 and the second axis sensor unit 202, it is possible to suppress the size of the board 240 from becoming large, and thus the device configuration can be suppressed from becoming larger.

Note that the other effects of the second embodiment are the same as those in the first embodiment.

Third Embodiment

Figure 6:
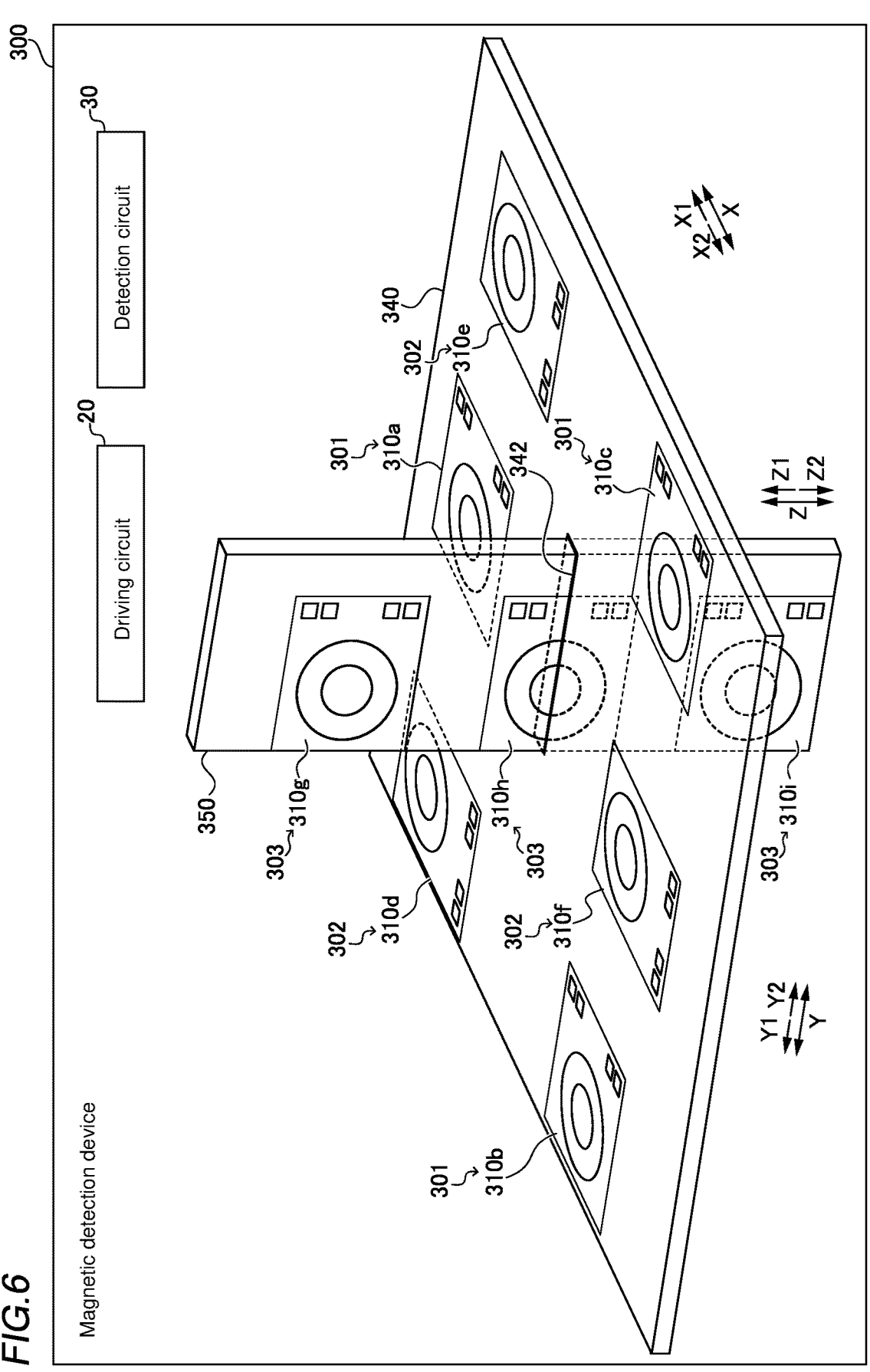
FIG. 6 is a perspective view showing an entire schematic configuration of a magnetic detection device according to a third embodiment.
Figure 7:
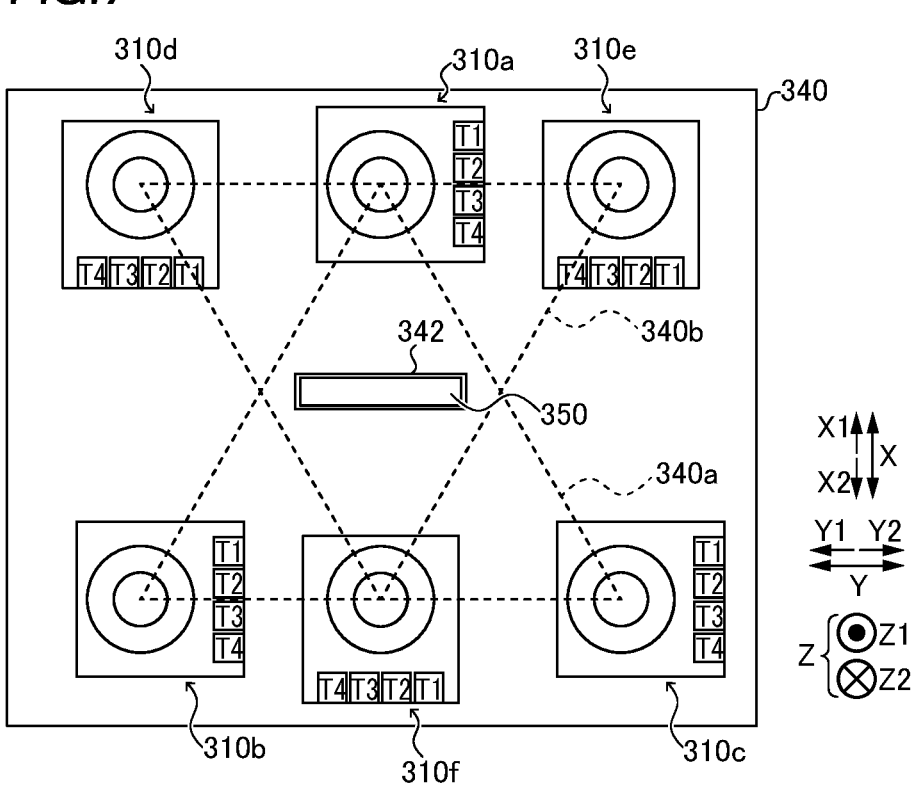
FIG. 7 is a top view of a board in a magnetic detection device according to the third embodiment.

Referring to FIG. 6 and FIG. 7, a third embodiment is described. In this third embodiment, unlike the first embodiment in which each of the first axis sensor unit 1, the second axis sensor unit 2, and the third axis sensor unit 3 is composed of two magnetic sensors, each of the first axis sensor unit 301, the second axis sensor unit 302, and the third axis sensor unit 303 is composed of three magnetic sensors.

Note that in the figure, the same reference symbols are assigned to the portions with the same configuration as in the above-described first embodiment.

(Configuration of Magnetic Detection Device According to Third Embodiment)

As shown in FIG. 6, the magnetic detection device 300 according to the third embodiment is provided with a plurality of magnetic sensors, i.e., a magnetic sensor 310a, a magnetic sensor 310b, a magnetic sensor 310c, a magnetic sensor 310d, a magnetic sensor 310e, a magnetic sensor 310f, a magnetic sensor 310g, and a magnetic sensor 310h, and a magnetic sensor 310i. Each of the plurality of magnetic sensors 310a to 310i has a mutually common configuration. Further, each of the plurality of magnetic sensors 310a to 310i has the same configuration as each of the plurality of magnetic sensors 10a to 10f according to the first embodiment.

In the third embodiment, the first axis sensor unit 301 is composed of three magnetic sensors, i.e., the magnetic sensor 310a, the magnetic sensor 310b, and the magnetic sensor 310c. Further, the second axis sensor unit 302 is composed of three magnetic sensors, i.e., the magnetic sensor 310d, the magnetic sensor 310e, and the magnetic sensor 310f. Further, the third axis sensor unit 303 is composed of three magnetic sensors, i.e., the magnetic sensor 310g, the magnetic sensor 310h, and the magnetic sensor 310i. Each of the magnetic sensors 310a to 310c of the first axis sensor unit 301 is the same as each of the magnetic sensor 10a and the magnetic sensor 10b of the first axis sensor unit 1 according to the first embodiment. Each of the magnetic sensors 310d to 310f of the second axis sensor unit 302 is the same as each of the magnetic sensor 10c and the magnetic sensor 10d of the second axis sensor unit 2 according to the first embodiment. Further, each of the magnetic sensors 310a to 310i of the third axis sensor unit 303 is the same as each of the magnetic sensor 10a and the magnetic sensor 10b of the third axis sensor unit 3 according to the first embodiment.

In the third embodiment, the magnetic sensors 310a to 310c of the first axis sensor unit 301 and the magnetic sensors 310d to 310f of the second axis sensor unit 302 are arranged on the board 340. That is, in each of the magnetic sensors 310a to 310f, the ring core 11, the excitation coil 12, and the signal coil 13 are arranged on the board 340. Further, the magnetic sensors 310g to 310i of the third axis sensor unit 303 are arranged on the board 350. In each of the magnetic sensors 310g to 310i, the ring core 11, the excitation coil 12, and the signal coil 13 are arranged on the board 350. The configurations of the ring core 11, the excitation coil 12, and the signal coil 13 in each of the board 340 and the board 350 are the same as those of the ring core 11, the excitation coil 12, and the signal coil 13 in the board 40 and the board 50 of the first embodiment. Note that the board 340 is one example of the "board" and the "first board" recited in claims. Note that the board 350 is one example of the "board" and the "second board" recited in claims.

As shown in FIG. 7, in the third embodiment, each of the three magnetic sensors, i.e., the magnetic sensor 310a, the magnetic sensor 310b, and the magnetic sensor 310c of the first axis sensor unit 301, is arranged at the position of the apex of triangle 340a on the board 340. Each of the three magnetic sensors, i.e., the magnetic sensor 310d, the magnetic sensor 310e, and the magnetic sensor 310f of the second axis sensor unit 302, is positioned at the apex of the inverted triangle 340b on the board 340. The inverted triangle 340b is a triangle that overlaps the triangle 340a located at the position where the three magnetic sensors 310a to 310c of the first axis sensor unit 301 are arranged. The triangle 340a and the inverted triangle 340b are equilateral triangles whose directions are opposite to each other. In the triangle 340a, the vertex on the X1-direction side overlaps the midpoint of the side along the Y-direction of the inverted triangle 340b. In the inverted triangle 340b, the vertex on the X2-direction side overlaps the midpoint of the side along the Y-direction of the inverted triangle 340a.

Thus, on the X1-direction side of the board 340, the magnetic sensor 310a of the first axis sensor unit 301 and the magnetic sensors 310d and 310e of the second axis sensor unit 302 are arranged side by side along the Y-direction. Further, on the X2-direction side of the board 340, the magnetic sensors 310b and 310c of the first axis sensor unit 301 and the magnetic sensor 310f of the second axis sensor unit 302 are arranged side by side along the Y-direction. The magnetic sensors 310a to 310c in the first axis sensor unit 301 are arranged so that the X-direction (first axial direction) is the detection direction, in the same manner as in the first axis sensor unit 1 of the first embodiment. Further, the magnetic sensors 310d to 310f in the second axis sensor unit 302 are arranged so that the Y-direction (second axial direction) is the detection direction, in the same manner as in the second axis sensor unit 2 of the first embodiment.

As shown in FIG. 6, the board 340 has a hole 342 through which the board 350 passes, similar to the board 40 of the first embodiment. In the board 350 penetrating the hole 342, the third axis sensor unit 303, which is composed of the magnetic sensors 310g to 310i, is arranged along the Z-direction. In the board 350, in order from the Z1-direction side, the magnetic sensor 310g, the magnetic sensor 310h, and the magnetic sensor 310i are arranged side by side so that the Z-direction (third axial direction) is a detection direction.

That is, in the third axis sensor unit 303, the sensitivity axis is common. The board 350 is arranged so that the position of the center of the magnetic sensors 310g to 310i of the third axis sensor unit 303 coincides with the position of the midpoint between the center (center of gravity) of the triangle 340a, where the magnetic sensors 310a to 310c of the first axis sensor unit 301 are arranged, and the center (center of gravity) of the inverted triangle 340b, where the magnetic sensors 310d to 310f of the second axis sensor unit 302 are arranged.

Note that the connection between each of the plurality of magnetic sensors 310a to 310i and the driving circuit 20 and the detection circuit 30 is the same as that in the first embodiment. In other words, the excitation coils 12 in the magnetic sensors 310a to 310i are connected in series with each other. Further, the signal coils 13 in the magnetic sensors 310a to 310c of the first axis sensor unit 301 are connected in series with each other. The signal coils 13 in the magnetic sensors 310a to 310f of the second axis sensor unit 302 are connected in series with each other. The signal coils 13 in the magnetic sensors 310g to 310i of the third axis sensor unit 303 are connected in series with each other. Further, the other configuration of the magnetic detection device 300 according to the third embodiment is the same as that in the first and second embodiments.

Effects of Third Embodiment

In the third embodiment, the following effects can be obtained.

In the third embodiment, as described above, the first axis sensor unit 301 is composed of three magnetic sensors 310a to 310c. The second axis sensor unit 302 is composed of three magnetic sensors 310d to 310f. Each of the three magnetic sensors 310a to 310c of the first axis sensor unit 301 is located at the apex of the triangle 340a on the board 340 (first board). Each of three of the three magnetic sensors 310d to 310f of the second axis sensor unit 302 is arranged at the apex of the inverted triangle 340b that overlaps the triangle 340a located at a position where three of the magnetic sensors 310a to 310c of the first axis sensor unit 301 are arranged.

By configuring as described above, by arranging the three magnetic sensors 310a to 310c of the first axis sensor unit 301 and the three magnetic sensors 310d to 310f of the second axis sensor unit 302 at the positions of the vertices of the triangles 340a and inverted triangles 340b, which overlap each other, respectively, it is possible to bring the position of the center of the three magnetic sensors of the first axis sensor unit 301 and the position of the center of the three magnetic sensors 310d to 310f of the second axis sensor unit 302 closer to each other.

Therefore, even in the case where three magnetic sensors 310a to 310c are arranged in the first axis sensor unit 301 and three magnetic sensors 310d to 310f are arranged in the second axis sensor unit 302, the detection position of the magnetic field in the first axial direction (X-direction) and the detection position of the magnetic field in the second axial direction (Y-direction) can be positioned close to each other. As a result, in each of the first axis sensor unit 301 and the second axis sensor unit 302, as compared with the case where two magnetic sensors are arranged, the detection sensitivity of the magnetic field can be improved, and the detection positions can be brought closer to each other.

Note that the other effects of the third embodiment are the same as those in the first and second embodiments.

Fourth Embodiment

Figure 8:
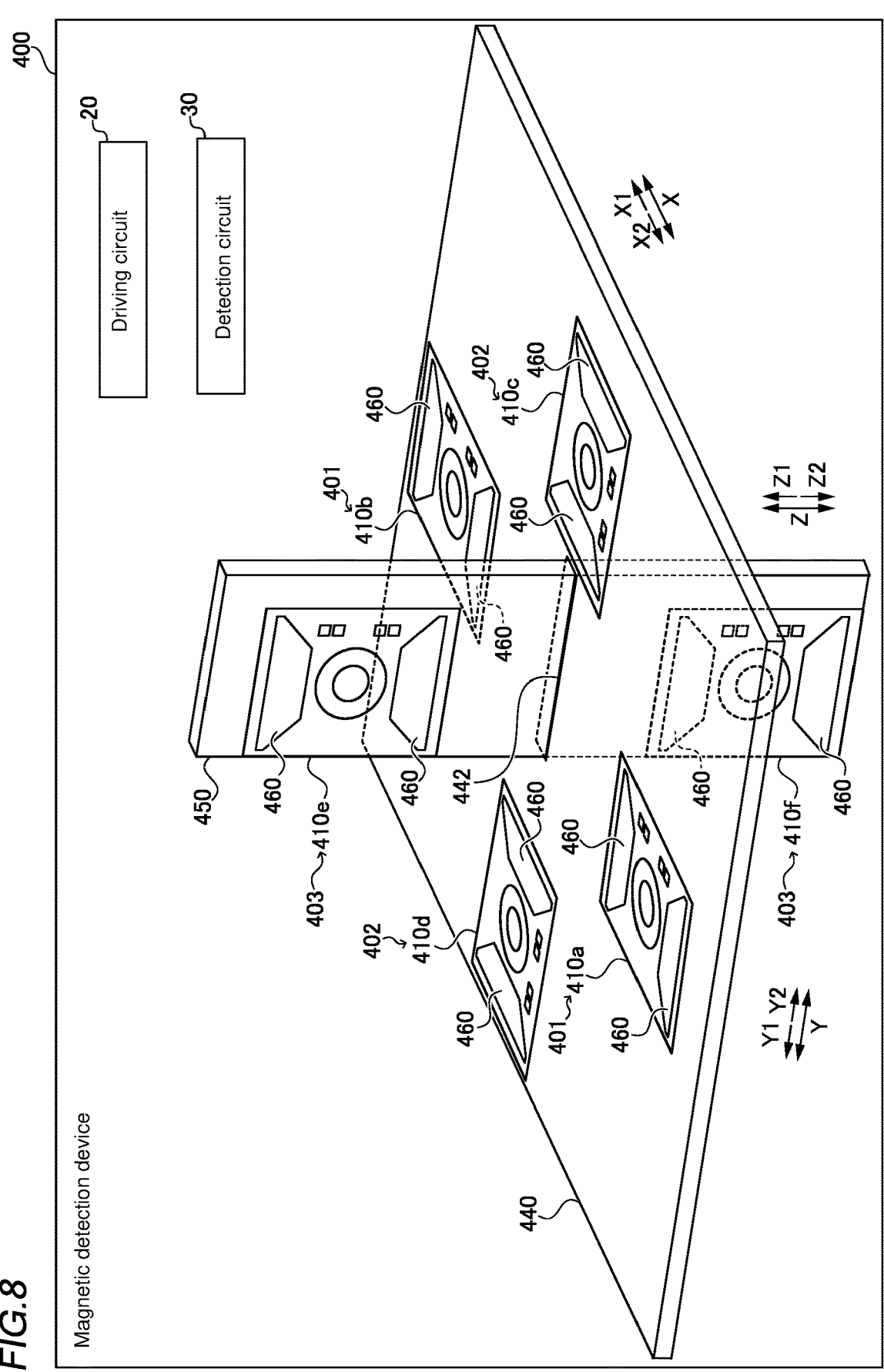
FIG. 8 is a perspective view showing an entire schematic configuration of a magnetic detection device according to a fourth embodiment.
Figures 9, 10:
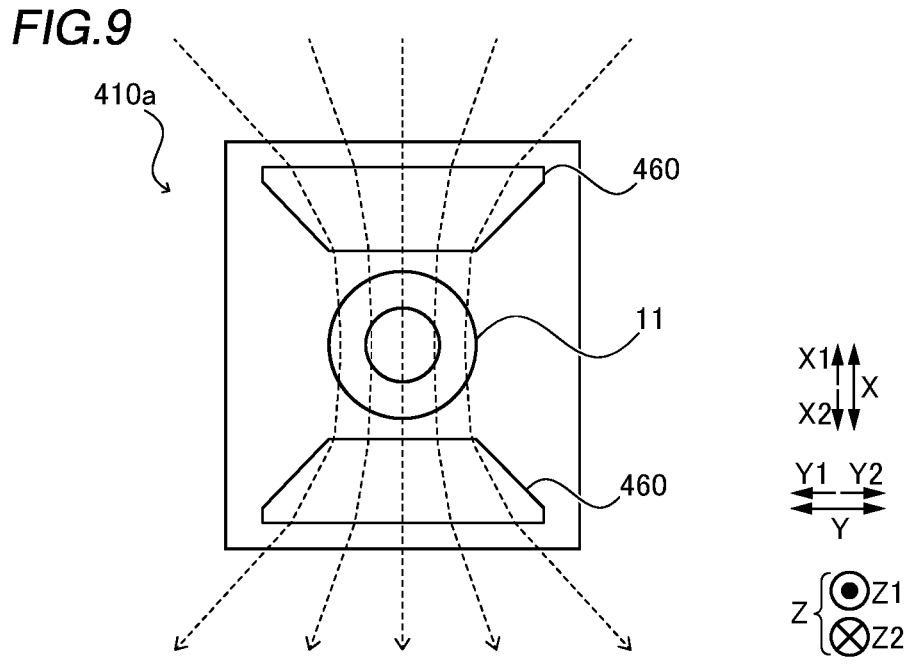
FIG. 9 is a schematic diagram for describing a configuration of a magnetic convergence section.
FIG. 10 is a diagram showing a magnetic convergence section according to a modification of the fourth embodiment of the present invention.

Referring to FIG. 8 and FIG. 9, a fourth embodiment is described. In this fourth embodiment, a magnetic convergence section 460 is provided for each of the plurality of magnetic sensors 410a to 410f. Note that in the figure, the same reference symbols are assigned to the portions with the same configuration as in the above-described first embodiment.

(Configuration of Magnetic Detection Device According to Fourth Embodiment)

As shown in FIG. 8, the magnetic detection device 400 according to the fourth embodiment is provided with a plurality of magnetic sensors, i.e., a magnetic sensor 410a, a magnetic sensor 410b, a magnetic sensor 410c, a magnetic sensor 410d, a magnetic sensor 410e, and a magnetic sensor 410f. Each of the plurality of magnetic sensors 410a to 410f has a mutually common configuration. Further, each of the plurality of magnetic sensors 410a to 410f includes a ring core 11, an excitation coil 12, and a signal coil 13, similar to each of the plurality of magnetic sensors 10a to 10f in the first embodiment.

Further, the first axis sensor unit 401 is composed of two of the magnetic sensor 410*a* and the magnetic sensor 410*b*. Further, the second axis sensor unit 402 is composed of two of the magnetic sensor 410*c* and the magnetic sensor 410*d*. Further, the third axis sensor unit 403 is composed of two of the magnetic sensor 410*e* and the magnetic sensor 410*f*.

Each of the magnetic sensors 410*a* and 410*b* of the first axis sensor unit 401 is arranged side by side along the X-direction on the board 440 so that the first axial direction (X-direction) is the detection direction, similar to each of the magnetic sensors 10*a* and 10*b* of the first axis sensor unit 1 of the first embodiment. Each of the magnetic sensors 410*c* and 410*d* of the first axis sensor unit 402 is arranged side by side along the Y-direction on the board 440 so that the second axial direction (Y-direction) is a detection direction, similar to each of the magnetic sensors 10*c* and 10*d* of the second axis sensor unit 2 of the first embodiment. Each of the magnetic sensors 410*e* and 410*f* of the third axis sensor unit 403 is arranged side by side along the Z-direction on the board 450 so that the third axial direction (Z-direction) is a detection direction, similar to each of the magnetic sensors 10*e* and 10*f* of the third axis sensor unit 3 of the first embodiment. Each of the magnetic sensors 410*a* and 410*b* of the first axis sensor unit 401 and each of the magnetic sensors 410*c* and 410*d* of the second axis sensor unit 402 on the board 440 are arranged in a cross shape, similar to the arrangement of the first axis sensor unit 1 and the second axis sensor unit 2 on the board 40 of the first embodiment. Further, the arrangement of the magnetic sensors 410*e* and 410*f* of the third axis sensor unit 403 on the board 450 is the same as the arrangement of the third axis sensor unit 3 of the first embodiment on the board 50. The board 450 is arranged to penetrate the hole 442 in the board 440 in the same manner as the board 50 in the first embodiment. Note that the board 440 is one example of the "board" and the "first board" recited in claims. Note that the board 450 is one example of the "board" and the "second board" recited in claims.

And in the fourth embodiment, the magnetic detection device 400 is provided with a magnetic convergence section 460 that converges the magnetic flux to the ring core 11 of each of the plurality of magnetic sensors 410*a* to 410*f*. Two magnetic convergence sections 460 are arranged for each of the plurality of magnetic sensors 410*a* to 410*f*.

Note that the magnetic convergence section 460 in each of the plurality of magnetic sensors 410*a* to 410*f* has the same configuration. In the following description, the magnetic convergence section 460 in the magnetic sensor 410*a* is illustrated and described, and the magnetic convergence sections 460 in the magnetic sensors 410*b* to 410*f* are omitted from the illustration.

As shown in FIG. 9, in the fourth embodiment, the magnetic convergence section 460 is arranged on the detection direction sides of the ring core 11 (magnetic core layer) in the plurality of magnetic sensors 410*a* to 410*f*. For example, in the magnetic sensor 410*a*, the magnetic convergence section 460 is arranged along the sensitivity axis with respect to the ring core 11 on each of the one side (X1-direction side) and the other side (X2-direction side) of the ring core 11 in the X-direction (first axial direction), which is the detection direction of the ring core 11.

The magnetic convergence section 460 is, for example, a thin film magnetic body layer formed along the main surface in each of the boards 440 and 450, similar to the ring core 11. The magnetic convergence section 460 is made of a soft magnetic material that forms a magnetic path. For example, the magnetic convergence section 460 is a permalloy thin film. The magnetic convergence section 460 is formed by sputter deposition and etching on each of the boards 440 and 450, similar to the ring core 11. Note that the magnetic convergence section 460 is arranged at the position equal from the ring core 11 in the thickness direction of each of the boards 440 and 450.

The magnetic convergence section 460 is a trapezoidal thin film. In the magnetic convergence section 460, the length of the side in the direction away from the ring core 11 along the detection direction is larger than the length of the side in the direction proximate to the ring core 11. As a result, in the magnetic convergence section 460, the magnetic flux from the side in the direction away from the ring core 11 along the detection direction is converged along the detection direction and output from the side in the direction close to the ring core 11. In other words, the magnetic convergence section 460 increases the magnetic flux density in each of the plurality of magnetic sensors 410*a* to 410*f* by means of a magnetic lensing effect.

For example, the magnetic convergence section 460 converges the magnetic flux input to the ring core 11 of the magnetic sensor 410*a*. The magnetic convergence section 460 converges the magnetic field (magnetic flux) oriented along the detection direction (X-direction) around the ring core 11 toward the ring core 11. In other words, the magnetic convergence section 460 converges the magnetic flux passing through the position outside the ring core 11 in the Y-direction so that it passes through the ring core 11.

Note that the other configuration of the magnetic detection device 400 according to the fourth embodiment is the same as in the first to third embodiments.

Effects of Fourth Embodiment

In the fourth embodiment, the following effects can be obtained.

In the fourth embodiment, as described above, the magnetic detection device 400 has a magnetic convergence section 460 that is arranged on the detection direction side of the ring core 11 (magnetic core layer) in the plurality of magnetic sensors 410*a* to 410*f* and that converges the magnetic flux to the ring core 11.

By configuring as described above, the magnetic flux can be converged with respect to the ring core 11 by the magnetic convergence section 460, and therefore, the detection sensitivity in each of the plurality of magnetic sensors 410*a* to 410*f* can be further improved. For this reason, in the case of detecting magnetic fields in a plurality of directions, the detection positions for each of the magnetic fields in the plurality of directions can be brought closer to each other while suppressing the reduction in sensitivity.

Note that the other effects of the fourth embodiment is the same as those in the first to third embodiments.

<Modifications>

Note that the embodiments disclosed here should be considered illustrative and not restrictive in all respects. It should be noted that the scope of the present invention is indicated by claims and is intended to include all modifications (modified examples) within the meaning and scope of the claims and equivalents.

For example, in the first to fourth embodiments described above, an example is shown in which the signal coils 13 of the plurality of magnetic sensors 10*a* to 10*f* (210*a* to 210*d*, 310*a* to 310*i*, 410*a* to 410*f*) are connected in series in the forward direction with respect to the detection circuit 30 for each axis, but the present invention is not limited thereto.

In the present invention, the signal coils of the plurality of magnetic sensors may be connected in parallel to each other with respect to the detection circuit. In this case, the S/N ratio is improved. Further, it may be configured such that the signal coils are not connected to each other, and a detection signal is output to the detection circuit for each signal coil.

Further, in the first to fourth embodiments described above, an example is shown in which the excitation coils 12 of the plurality of magnetic sensors 10a to 10f (210a to 210d, 310a to 310i, 410a to 410f) are connected in series to flow an AC current from a common driving circuit 20, but the present invention is not limited thereto.

In the present invention, an AC current from a separate driving circuit may be applied to each of the excitation coils of the plurality of magnetic sensors. For example, a common driving circuit may be arranged for each axis. Further, one common drive circuit may be arranged for each of the first board and the second board. Further, in the case where an AC current from a common driving circuit is input, the excitation coils may be connected in parallel with each other.

Further, in the first to fourth embodiments described above, an example is shown in which the conductor pattern formed on each of the one side and the other side in the direction intersecting the board (first board) 40 (240, 340, 440) and the board (second board) 50 (350, 450) for the ring core 11 (magnetic core layer) having a circular shape, is used to configure the excitation coil 12 and the signal coil 13 that wind the ring core 11, but the present invention is not limited thereto.

In the present invention, it may be configured such that the excitation coil and the signal coil are wound around a plate-shaped (bar-shaped) magnetic core layer. In such a case, it may be configured such that the excitation coil and the signal coil are wound along the main surface of the board.

Further, in the first, second, and fourth embodiments described above, an example is shown in which each of the first axis sensor unit 1 (201, 401), the second axis sensor unit 2 (202, 402), and the third axis sensor unit 3 (403) is composed of two magnetic sensors 10a to 10f (210a to 210d, 410a to 410f), and in the third embodiment, an example is shown in which each of the first axis sensor unit 301, the second axis sensor unit 302, and the third axis sensor unit 303 is composed of three magnetic sensors 310a to 310i, but the present invention is not limited thereto.

In the present invention, the second axis sensor unit may be composed of a single magnetic sensor. Further, the third axis sensor unit may be composed of a single magnetic sensor. Further, the number of magnetic sensors in each of the first axis sensor unit, the second axis sensor unit, and the third axis sensor unit may be different from each other. Further, it may be configured such that without providing a third axis sensor unit, a two-axis magnetic sensor is composed of a first axis sensor unit and a second axis sensor unit. For example, in the case where the magnetic detection device is a two-axis magnetic sensor, the first axis sensor unit may be composed of two magnetic sensors arranged along the detection direction, and the second axis sensor unit may be composed of a single magnetic sensor between the two magnetic sensors of the first axis sensor unit.

Further, in the first to fourth embodiments described above, an example is shown in which the board (second board) 50 (350, 450) is arranged to penetrate the hole 42 (242, 342, 442) in the board (first board) 40 (240, 340, 440), but the present invention is not limited thereto.

In the present invention, it may be configured such that without providing a hole in the first board, a magnetic sensor composing a third axis sensor unit is arranged at least on one of the one side and the other side of the main surface of the first board. For example, in the case where the third axis sensor unit is composed of two magnetic sensors, the magnetic sensors composing the third axis sensor unit may be arranged on mutually separated boards.

Further, in the first to fourth embodiments described above, an example is shown in which the excitation coil 12 and signal coil 13 of each of the plurality of magnetic sensors 10a to 10f (210a to 210d, 310a to 310i, 410a to 410f) are formed on a common board (first board) 40 (240, 340, 440) and board (second board) 50 (350, 450) as a conductor pattern, but the present invention is not limited thereto.

In the present invention, a plurality of magnetic sensors arranged on mutually separate boards may be arranged side by side. A plurality of magnetic sensors each having a flat shape may be superimposed in the thickness direction so that they are stacked. Further, two magnetic sensors may be arranged for each axis on opposite sides of the cube.

Further, in the first, second, and fourth embodiments described above, an example is shown in which the position of the centers of the magnetic sensors 10a and 10b (210a and 210b, 410a and 410b) of the first axis sensor unit 1 (201, 401) and the position of the centers of the magnetic sensors 10c and 10d (210c and 210d, 410c and 410d) of the second axis sensor unit 2 (202, 402) are aligned with each other, but the present invention is not limited thereto.

In the present invention, the position of the center of the magnetic sensor of the first axis sensor unit and the position of the center of the magnetic sensor of the second axis sensor unit may not coincide with each other. Further, in the same manner for the third axis sensor unit, the position of the center of the magnetic sensor of the third axis sensor unit may not coincide with at least one of the position of the center of the magnetic sensor of the first axis sensor unit and the position of the center of the magnetic sensor of the second axis sensor unit.

In the first to fourth embodiments described above, an example is shown in which the excitation coils 12 of the plurality of magnetic sensors 10a to 10f (210a to 210d, 310a to 310i, 410a to 410f) have a common winding number with each other, and the signal coils 13 also have a common winding number with each other, but the invention is not limited thereto. In the present invention, it may be configured such that at least one of the excitation coils and the signal coils of each of the plurality of magnetic sensors differ in winding number from each other.

Further, in the first to fourth embodiments described above, an example is shown in which the driving circuit 20 and the detection circuit 30 are configured in a common hybrid IC, but the invention is not limited thereto. In the present invention, the drive circuitry and detection circuitry may be configured in separate hardware from each other. Further, the driving circuit and the detection circuit may be configured by a control circuit or other device other than a hybrid IC.

Further, in the fourth embodiment described above, an example is shown in which two magnetic convergence sections 460, which are trapezoidal thin films, are arranged on each side of the ring core 11 (magnetic core layer) in the detection direction in each of the plurality of magnetic sensors 410a to 410f, but the present invention is not limited thereto.

In the present invention, the magnetic convergence section may be arranged on one side of the detection direction for each of the plurality of magnetic sensors. Further, a common magnetic convergence section may be arranged for a plurality of magnetic sensors. For example, in the case where a plurality of magnetic core layers is arranged side by side along the detection direction with a common axis of sensitivity, one magnetic convergence section may be commonly arranged on each of one side and the other side of the detection direction for the plurality of magnetic core layers arranged side by side. Further, the shape of the magnetic convergence section need not be trapezoidal. In other words, the shape of the magnetic convergence section is not limited to a trapezoidal shape as long as the length of the side that is distant from the magnetic core layer is longer than the length of the side that is proximate to the magnetic core layer. For example, the magnetic convergence section may be formed as a pentagonal thin film, as in the magnetic convergence section 560 according to the modification shown in FIG. 10.

ASPECTS

It would be understood by those skilled in the art that the exemplary embodiments described above are specific examples of the following aspects.

(Item 1)

A magnetic detection device comprising:

a plurality of magnetic sensors each including an excitation coil, a signal coil, and a magnetic core layer, the excitation coil and the signal coil each being formed as a conductor pattern on a board, the magnetic core layer being arranged on the board;

a driving circuit configured to output an AC current to the excitation coil; and a detection circuit configured to acquire a detection signal from the signal coil, wherein a first axis sensor unit is constituted by at least two magnetic sensors out of the plurality of magnetic sensors, the at least two magnetic sensors being each arranged such that a detection direction thereof is aligned with a first axial direction, and wherein a second axis sensor unit is constituted by at least one magnetic sensor out of the plurality of magnetic sensors, the at least one magnetic sensor being arranged such that a detection direction thereof is aligned with a second axial direction intersecting with the first axial direction.

(Item 2)

The magnetic detection device as recited in the above-described Item 1, wherein a third axis sensor unit is further constituted by at least one magnetic sensor out of the plurality of magnetic sensors, the at least one magnetic sensor constituting the third axis sensor unit being arranged such a detection direction thereof is aligned with a third axial direction intersecting with a plane formed by the first axial direction and the second axial direction, and wherein the at least one magnetic sensor in the third axis sensor unit is arranged on an axis line passing between the at least two magnetic sensors in the first axis sensor unit.

(Item 3)

The magnetic detection device as recited in the above-described Item 1 or 2, wherein the number of the magnetic sensors in the second axis sensor unit is equal to the number of magnetic sensors in the first axis sensor unit.

(Item 4)

The magnetic detection device as recited in any one of the above-described Items 1 to 3, wherein the excitation coil and the signal coil of the magnetic sensor in the first axis sensor unit and the excitation coil and the signal coil of the magnetic sensor in the second axis sensor unit are each formed as the conductor pattern on a first board which is the board common to the first axis sensor unit and the second axis sensor unit.

(Item 5)

The magnetic detection device as recited in the above-described Item 4, wherein the second axis sensor unit is composed of at least two of the magnetic sensors, wherein the third axis sensor unit is further constituted by at least one magnetic sensor out of the plurality of magnetic sensors, the at least one magnetic sensor constituting the third axis sensor unit being arranged such that a detection direction thereof is aligned with a third axial direction intersecting with a plane formed by the first axial direction and the second axial direction, wherein the excitation coil and the signal coil of the magnetic sensor in the third axis sensor unit are each formed as the conductor pattern on a second board separate from the first board, and wherein the second board is arranged to penetrate a hole formed in the first board.

(Item 6)

The magnetic detection device as recited in the above-described Item 4 or 5, wherein the first axis sensor unit is composed of two of the magnetic sensors arranged side by side along the first axial direction, wherein the second axis sensor unit is composed of two of the magnetic sensors arranged side by side along the second axial direction, and wherein the two of the magnetic sensors in the first axis sensor unit and the two of the magnetic sensors in the second axis sensor unit are arranged such that a line connecting the two of the magnetic sensors in the first axis sensor unit and a line connecting the two of the magnetic sensors in the second axis sensor unit intersect each other perpendicularly.

(Item 7)

The magnetic detection device as recited in the above-described Item 4 or 5, wherein the first axis sensor unit is composed of two of the magnetic sensors, wherein the second axis sensor unit is composed of two of the magnetic sensors, wherein the first board has a rectangular shape, and wherein the two of the magnetic sensors in the first axis sensor unit and the two of the magnetic sensors in the second axis sensor unit are arranged on diagonal lines of the first board of a rectangular shape.

(Item 8)

The magnetic detection device as recited in the above-described Item 4 or 5, wherein the first axis sensor unit is composed of two of the magnetic sensors, wherein the second axis sensor unit is composed of two of the magnetic sensors, wherein the first board has a rectangular shape, and wherein the two of the magnetic sensors in the first axis sensor unit and the two of the magnetic sensors in the second axis sensor unit are arranged on diagonal lines of the first board of a rectangular shape.

(Item 9)

The magnetic detection device as recited in any one of the above-described Items 1 to 8, wherein the magnetic core layer has a circular shape, the magnetic core layer being arranged along a main surface of the board as a layer formed on the board, wherein the excitation coil and the signal coil are arranged so as to alternately wind around the magnetic core layer along a circumferential direction of the magnetic core layer of a circular shape, wherein the signal coil is arranged while reversing a winding direction every half circumference of the magnetic core layer, and wherein the at least two magnetic sensors of the first axis sensor unit are each arranged such that the detection direction which is a direction of a position where the winding direction of the signal coil is reversed on the magnetic core layer is aligned with the first axial direction which is common to the at least two magnetic sensors.

(Item 10)

The magnetic detection device as recited in any one of the above-described Items 1 to 9, wherein the excitation coil of the magnetic sensor in the first axis sensor unit and the excitation coil of the magnetic sensor in the second axis sensor unit are connected in series with each other and are configured such that an AC current from the driving circuit which is common to both the first axis sensor unit and the second axis sensor unit is input to both the excitation coils.

(Item 11)

The magnetic detection device as recited in any one of the above-described Items 1 to 10, a magnetic convergence section arranged on a detection direction side of the magnetic core layer in the plurality of magnetic sensors to converge a magnetic flux with respect to the magnetic core layer.

The invention claimed is:

1. A magnetic detection device comprising:

a plurality of magnetic sensors each including an excitation coil, a signal coil, and a magnetic core layer, the excitation coil and the signal coil each being formed as a conductor pattern on a board, the magnetic core layer being arranged on the board;

a driving circuit configured to output an AC current to the excitation coil; and a detection circuit configured to acquire a detection signal from the signal coil, wherein a first axis sensor unit is constituted by at least two magnetic sensors out of the plurality of magnetic sensors, the at least two magnetic sensors being each arranged such that a detection direction thereof is aligned with a first axial direction, wherein a second axis sensor unit is constituted by at least one magnetic sensor out of the plurality of magnetic sensors, the at least one magnetic sensor being arranged such that a detection direction thereof is aligned with a second axial direction intersecting with the first axial direction, wherein the first axis sensor unit and the second axis sensor unit are formed on a first board which is the board common to the first axis sensor unit and the second axis sensor unit, wherein a third axis sensor unit is further constituted by at least one magnetic sensor out of the plurality of magnetic sensors, and the at least one magnetic sensor constituting the third axis sensor unit is arranged such that a detection direction thereof is aligned with a third axial direction intersecting with a plane formed by the first axial direction and the second axial direction, and wherein the third axis sensor unit is formed on a second board separate from the first board.

2. The magnetic detection device as recited in claim 1, wherein the at least one magnetic sensor in the third axis sensor unit is arranged on an axis line passing between the at least two magnetic sensors in the first axis sensor unit.

3. The magnetic detection device as recited in claim 1, wherein the number of the magnetic sensors in the second axis sensor unit is equal to the number of magnetic sensors in the first axis sensor unit.

4. The magnetic detection device as recited in claim 1, wherein the excitation coil and the signal coil of the magnetic sensor in the first axis sensor unit and the excitation coil and the signal coil of the magnetic sensor in the second axis sensor unit are each formed as the conductor pattern on a first board.

5. The magnetic detection device as recited in claim 4, wherein the second axis sensor unit is composed of at least two of the magnetic sensors, wherein the excitation coil and the signal coil of the magnetic sensor in the third axis sensor unit are each formed as the conductor pattern on the second board; and wherein the second board is arranged to penetrate a hole formed in the first board.

6. The magnetic detection device as recited in claim 4, wherein the first axis sensor unit is composed of two of the magnetic sensors arranged side by side along the first axial direction, wherein the second axis sensor unit is composed of two of the magnetic sensors arranged side by side along the second axial direction, and wherein the two of the magnetic sensors in the first axis sensor unit and the two of the magnetic sensors in the second axis sensor unit are arranged such that a line connecting the two of the magnetic sensors in the first axis sensor unit and a line connecting the two of the magnetic sensors in the second axis sensor unit intersect each other perpendicularly.

7. The magnetic detection device as recited in claim 4, wherein the first axis sensor unit is composed of two of the magnetic sensors, wherein the second axis sensor unit is composed of two of the magnetic sensors, wherein the first board has a rectangular shape, and wherein the two of the magnetic sensors in the first axis sensor unit and the two of the magnetic sensors in the second axis sensor unit are arranged on diagonal lines of the first board of a rectangular shape.

8. The magnetic detection device as recited in claim 4, wherein the first axis sensor unit is composed of three of the magnetic sensors, wherein the second axis sensor unit is composed of three of the magnetic sensors, wherein the three of the magnetic sensors of the first axis sensor unit are arranged at respective apex positions of a triangle on the first board, and wherein the three of the magnetic sensors of the second axis sensor unit are arranged at respective apexes of an inverted triangle that overlaps the triangle arranged at a position where the three of the magnetic sensors of the first axis sensor unit are arranged.

9. The magnetic detection device as recited in claim 1, wherein the magnetic core layer has a circular shape, the magnetic core layer being arranged along a main surface of the board as a layer formed on the board, wherein the excitation coil and the signal coil are arranged so as to alternately wind around the magnetic core layer along a circumferential direction of the magnetic core layer of a circular shape, wherein the signal coil is arranged while reversing a winding direction every half circumference of the magnetic core layer, and wherein the at least two magnetic sensors of the first axis sensor unit are each arranged such that the detection direction which is a direction of a position where the winding direction of the signal coil is reversed on the magnetic core layer is aligned with the first axial direction which is common to the at least two magnetic sensors.

10. The magnetic detection device as recited in claim 1, wherein the excitation coil of the magnetic sensor in the first axis sensor unit and the excitation coil of the magnetic sensor in the second axis sensor unit are connected in series with each other and are configured such that an AC current from the driving circuit which is common to both the first axis sensor unit and the second axis sensor unit is input to both the excitation coils.

11. The magnetic detection device as recited in claim 1, further comprising:

a magnetic convergence section arranged on a detection direction side of the magnetic core layer in the plurality of magnetic sensors to converge a magnetic flux with respect to the magnetic core layer.

* * * * *